United States Patent
Lee et al.

(10) Patent No.: US 11,768,233 B2
(45) Date of Patent: Sep. 26, 2023

(54) METHOD FOR IDENTIFYING EXTERNAL DEVICE BY REGISTERING FEATURES OF EM SIGNAL AND ELECTRONIC DEVICE APPLYING SAID METHOD

(71) Applicant: Samsung Electronics Co., Ltd., Gyeonggi-do (KR)

(72) Inventors: Yuwon Lee, Gyeonggi-do (KR); Hwangki Min, Gyeonggi-do (KR); Shunghyun Choi, Gyeonggi-do (KR); Doosuk Kang, Gyeonggi-do (KR); Seungnyun Kim, Gyeonggi-do (KR)

(73) Assignee: Samsung Electronics Co., Ltd

( * ) Notice: Subject to any disclaimer, the term of this patent is extended or adjusted under 35 U.S.C. 154(b) by 225 days.

(21) Appl. No.: 17/421,156

(22) PCT Filed: Dec. 17, 2019

(86) PCT No.: PCT/KR2019/017846
§ 371 (c)(1),
(2) Date: Jul. 7, 2021

(87) PCT Pub. No.: WO2020/145536
PCT Pub. Date: Jul. 16, 2020

(65) Prior Publication Data
US 2022/0074982 A1    Mar. 10, 2022

(30) Foreign Application Priority Data
Jan. 9, 2019 (KR) .......... 10-2019-0002893

(51) Int. Cl.
*G06V 10/40* (2022.01)
*G01R 29/08* (2006.01)
(Continued)

(52) U.S. Cl.
CPC ..... *G01R 29/0814* (2013.01); *G01R 29/0871* (2013.01); *G06F 18/21* (2023.01); *G06F 18/22* (2023.01)

(58) Field of Classification Search
CPC . G01R 29/0814; G01R 29/0871; G06F 18/21; G06F 18/22; G06F 18/24133; G06N 3/08; G06V 10/40
See application file for complete search history.

(56) References Cited

U.S. PATENT DOCUMENTS 9,224,019 B2  12/2015  Weigmann et al.
9,485,266 B2  11/2016  Baxley et al.
(Continued)

FOREIGN PATENT DOCUMENTS

KR  10-2014-0024531  3/2014
KR  10-2015-0048210  5/2015
KR  10-2015-0083013  7/2015

OTHER PUBLICATIONS

PCT/ISA/210 Search Report issued on PCT/KR2019/017846, dated Apr. 29, 2020, pp. 11.
(Continued)

*Primary Examiner* — Tung S Lau
(74) *Attorney, Agent, or Firm* — The Farrell Law Firm, P.C.

(57) ABSTRACT

A method by which an electronic device interworks with an external device may be disclosed, the method comprising the operations of: obtaining an EM signal from the external device; extracting feature data by passing the obtained EM signal through a feature extraction model; receiving information related to the external device; generating registration information on the basis of the extracted feature data and the information related to the external device; and storing the generated registration information in a database of a memory, wherein the operation of receiving the information
(Continued)

US 11,768,233 B2
Page 2 related to the external device provides an input interface for inputting information related to the external device, or shows at least one piece of pre-stored information related to the external device. In addition, other various embodiments identified through the specification are also possible.

11 Claims, 17 Drawing Sheets

(51) Int. Cl.
*G06F 18/21* (2023.01)
*G06F 18/22* (2023.01)

(56) References Cited

U.S. PATENT DOCUMENTS

| | | | |
|---|---|---|---|
| 9,551,781 B2 | 1/2017 | Baxley et al. | |
| 9,560,060 B2 | 1/2017 | Baxley et al. | |
| 9,625,564 B2 | 4/2017 | Baxley et al. | |
| 9,665,648 B2* | 5/2017 | Sathish | G06F 16/367 |
| 9,736,175 B2 | 8/2017 | Baxley et al. | |
| 9,739,868 B2 | 8/2017 | Baxley et al. | |
| 9,880,256 B2 | 1/2018 | Baxley et al. | |
| 9,881,273 B2 | 1/2018 | Yang et al. | |
| 9,894,115 B2 | 2/2018 | Kim et al. | |
| 9,945,928 B2 | 4/2018 | Baxley et al. | |
| 10,104,098 B2 | 10/2018 | Baxley et al. | |
| 10,122,736 B2 | 11/2018 | Baxley et al. | |
| 10,141,929 B2 | 11/2018 | Rakova et al. | |
| 10,366,118 B2 | 7/2019 | Sample et al. | |
| 2013/0054603 A1* | 2/2013 | Birdwell | G06F 16/2465 |
| | | | 707/738 |
| 2014/0053086 A1 | 2/2014 | Kim et al. | |
| 2014/0084133 A1 | 3/2014 | Weigmann et al. | |
| 2015/0349810 A1 | 12/2015 | Baxley et al. | |
| 2015/0350228 A1 | 12/2015 | Baxley et al. | |
| 2016/0127404 A1* | 5/2016 | Baxley | H04L 63/1416 |
| | | | 726/22 |
| 2016/0261268 A1 | 9/2016 | Rakova et al. | |
| 2017/0046426 A1* | 2/2017 | Pearce | G06F 16/334 |
| 2017/0124816 A1 | 5/2017 | Yang et al. | |
| 2017/0243231 A1* | 8/2017 | Withrow | G06F 18/22 |
| 2017/0270198 A1 | 9/2017 | Sample et al. | |
| 2018/0350364 A1* | 12/2018 | Park | B60K 35/00 |

OTHER PUBLICATIONS

PCT/ISA/237 Written Opinion issued on PCT/KR2019/017846, dated Apr. 29, 2020, pp. 5.

* cited by examiner

METHOD FOR IDENTIFYING EXTERNAL DEVICE BY REGISTERING FEATURES OF EM SIGNAL AND ELECTRONIC DEVICE APPLYING SAID METHOD

PRIORITY

This application is a National Phase Entry of PCT International Application No. PCT/KR2019/017846, which was filed on Dec. 17, 2019, and claims priority to Korean Patent Application No. 10-2019-0002893, which was filed on Jan. 9, 2019, the entire content of each of which is incorporated herein by reference.

TECHNICAL FIELD

Various embodiments disclosed in the disclosure relate to technologies of registering a feature of an EM signal generated from an external device and identifying the external device based on the registered feature.

BACKGROUND ART

A recent electronic device may identify an external device which is a surrounding electric or electronic device. Each of external devices such as a. TV, a fridge, and a speaker may emit a unique electromagnetic (EM) signal depending on its characteristic such as a configuration and/or an operation scheme of the corresponding device. The electronic device may identify a type or a model name of the external device by using the EM signal generated from the external device as a unique fingerprint of the external device. After identifying and/or recognizing the external device, the electronic device may provide a connection service such as a connection with the corresponding external device or control of the corresponding external device.

The electronic device may previously collect and learn EM signals generated from a plurality of external devices. The electronic device may apply the learned data to a classifier. When the EM signal is input, the classifier may configure a discriminative model of assigning a fit or reliability score for each of external devices included in learning data. When the EM signal generated by any external device is input, the electronic device may identify the any external device using the discriminative model.

DISCLOSURE

Technical Problem

An electronic device which uses a discriminative model to identify an EM signal generated by an external device may identify only the external device included in learning data of generating and/or updating the discriminative model. The electronic device may not identify a new model or other external devices, which are not included in the learning data, before collecting the learning data.

Furthermore, it may not easy to continue collecting and managing learning data to maintain the range and accuracy of the learning data.

Furthermore, because the EM signal of the external device is distorted by noise according to an operation environment of the electronic device, it may not easy for the electronic device to identify the external device.

According to various embodiments disclosed in the disclosure, the electronic device may identify an external device which is not included in learning data and may reduce burden on collection and management of the learning data.

According to various embodiments of the disclosure, the electronic device may provide a method for identifying an external device robust to noise.

Technical Solution

In accordance with an aspect of the disclosure, a method for interworking with an external device in an electronic device is provided. The method may include obtaining an EM signal from the external device, passing the obtained EM signal through a feature extraction model to extract feature data, receiving information associated with the external device, generating registration information based on the extracted feature data and the information associated with the external device, and storing the generated registration information in a database of a memory. The receiving of the information associated with the external device is providing an input interface for inputting the information associated with the external device or showing at least one previously stored information associated with the external device.

In accordance with another aspect of the disclosure, an electronic device is provided. The electronic device may include an input device, a display device, a communication module, an EM sensing circuit configured to obtain an EM signal, at least one processor operationally connected with the input device, the display device, the communication module, and the EM sensing circuit, and a memory operationally connected with the processor. The memory may store instructions, when executed, causing the processor to obtain an EM signal from an external device, using the EM sensing circuit, apply the obtained EM signal to a feature extraction model to extract feature data, store information mapping the external device and the electronic device in a database included in the memory, and registering an associated service with an external device identified based on the feature data.

In accordance with another aspect of the disclosure, a method for identifying an external device in an electronic device is provided. The method may include sensing an EM signal from the external device, passing the sensed EM signal through a feature extraction model learned using learning data to extract feature data, comparing a similarity between the extracted feature data and feature data registered in a memory of the electronic device, and expanding the registered feature data or registering information associated with the external device, based on the compared result.

Advantageous Effects

According to various embodiments disclosed in the disclosure, the electronic device may identify an external device using a feature of an EM signal to identify an external device which is not included in learning data.

According to various embodiments disclosed in the disclosure, the electronic device may extract feature data of an EM signal collected from an external device to reduce burden on collection and management of learning data.

According to various embodiments disclosed in the disclosure, the electronic device may perform comparison with the EM signal itself and may identify an external device matched with the corresponding feature by using feature data in which distortion by noise is reduced as the input, thus providing a method for identifying an external device robust to noise.

In addition, various effects ascertained directly or indirectly through the disclosure may be provided.

With regard to description of drawings, the same or similar denotations may be used for the same or similar components.

MODE FOR INVENTION

Hereinafter, various embodiments of the disclosure may be described with reference to accompanying drawings. However, it should be understood that this is not intended to limit the present disclosure to specific implementation forms and includes various modifications, equivalents, and/or alternatives of embodiments of the present disclosure.

Figure 1:
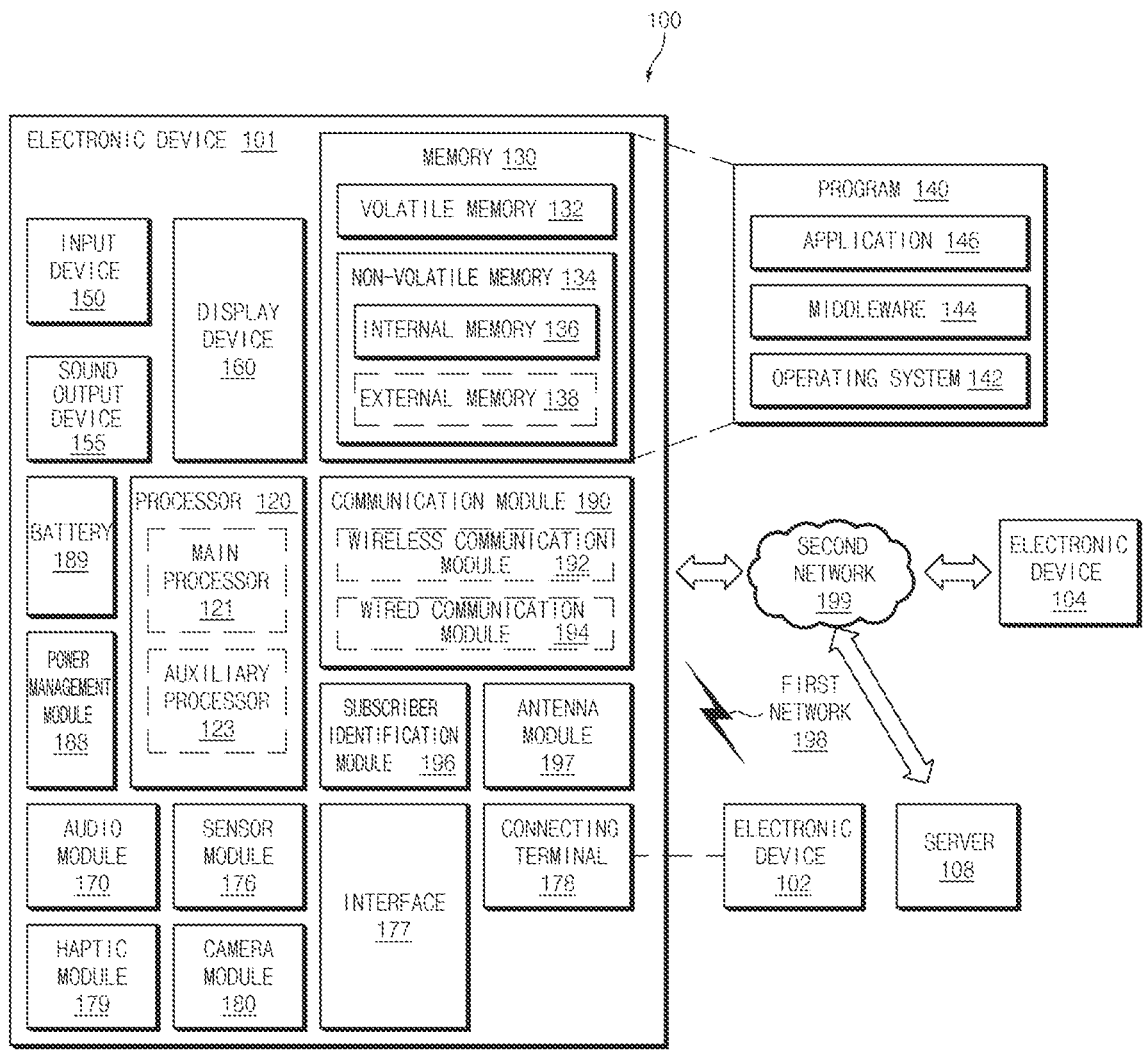
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor huh processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuit (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GLASS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network. (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
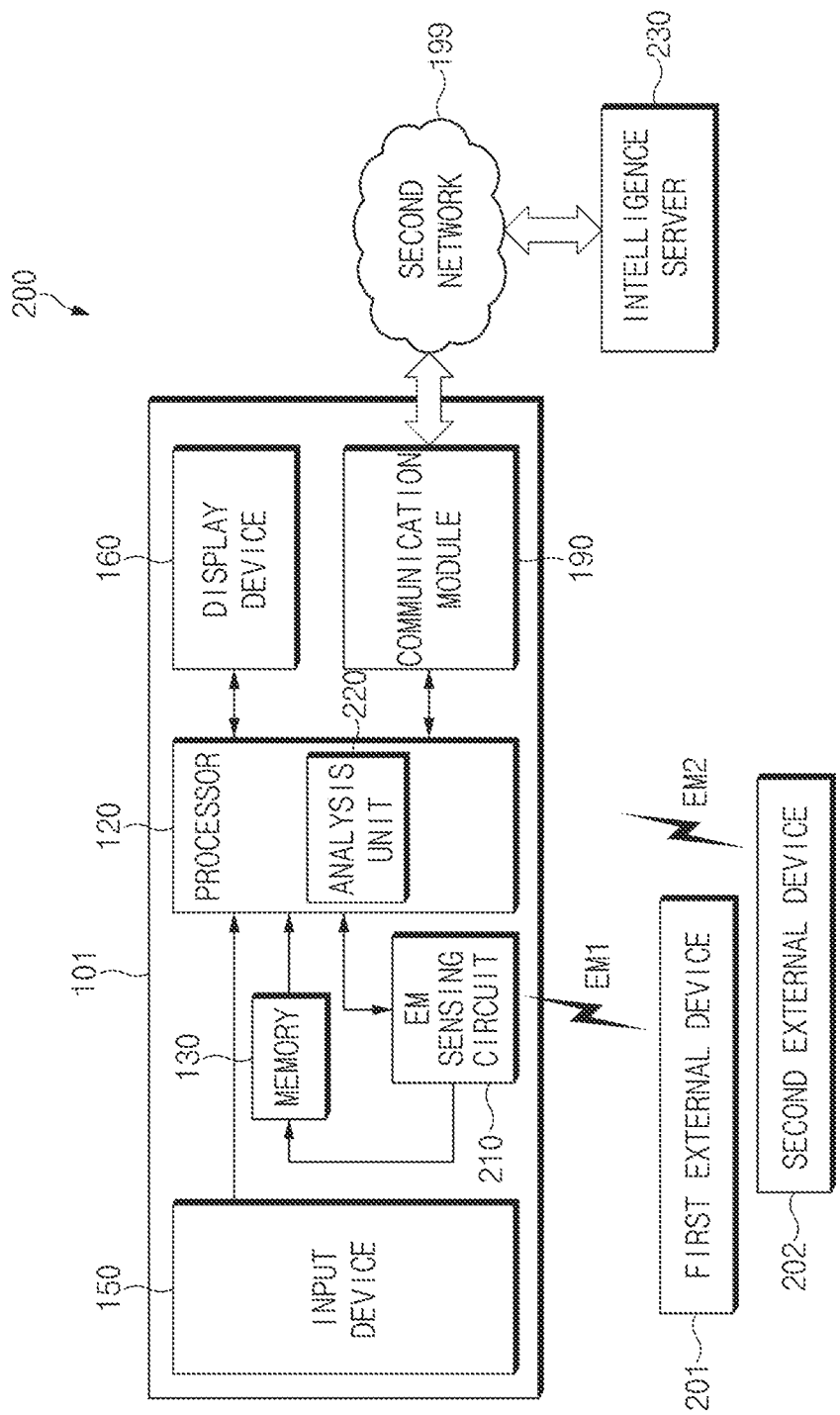
FIG. 2 is a block diagram illustrating an electronic device for obtaining an EM signal according to an embodiments.

FIG. 2 is a block diagram 200 illustrating an electronic device 101 for obtaining an EM signal EM1 or EM2 according to an embodiment. The electronic device 101 according to an embodiment may include an input device 150, a display device 160, a communication module 190, a processor 120, and an EM sensing circuit 210.

In an embodiment, the input device 150 may obtain various types of inputs performed by a user. The input device 150 may receive a command or data to be input to the electronic device 101 from the outside of the electronic device 101. The inputs of the user may include a touch input, a drag input, or a voice input.

In an embodiment, the display device 160 may display information about the input of the user obtained from the input device 150 as an image or text. For example, the display device 160 may display contents of the obtained voice input as text. When the electronic device 101 performs an operation corresponding to the obtained input of the user, the display device 160 may display an image indicating the operation performed by the electronic device 101.

In an embodiment, the communication module 190 may transmit information the electronic device 101 has to an intelligence server 230 over a second network 199. The communication module 190 may transmit information associated with the electronic device 101 and the external device 201 or 202 to the intelligence server 230.

In an embodiment, the processor 120 may be operationally connected with the input device 150, the display device 160, the communication module 190, and the EM sensing circuit 210. The processor 120 may analyze the input of the user, obtained by the input device 150, and may perform preparations to implementing an operation according to contents of the input. The processor 120 may provide image data such that the display device 160 may display an image. The processor 120 may set a type and contents of information transmitted and received by the communication module 190.

In an embodiment, the EM sensing circuit 210 may receive the EM signal EM1 or EM2 of the at least one external device 201 or 202. According to an embodiment, the EM sensing circuit 210 may generate EM signal data based on the EM signal. The EM signal data may include information about a waveform of the EM signal or information about a type of the at least one external device 201 or 202 which emits the EM signal. For example, the EM sensing circuit 210 may receive the first EM signal EM1 from the first external device 201 and may generate first EM signal data about the first EM signal EM1 using an amplitude and phase of the waveform of the first EM signal EM1.

According to an embodiment, the EM sensing circuit 210 may be operationally connected with the processor 120. The EM sensing circuit 210 may provide the processor 120 with the EM signal data. The electronic device 101 may store information associated with the external device 201 or 202 in the EM sensing circuit 210 or the memory 130. The electronic device 101 may analyze the EM signal data. The processor 120 of the electronic device 101 may include an analysis unit 220 which analyzes the EM signal data. The analysis unit 220 may analyze the EM signal data to know information associated with the external device 201 or 202, which is included in the EM signal data.

In an embodiment, when the electronic device 101 constructs a system (e.g., Bixby™) which recognizes a voice of the user and processes the voice internally or using the intelligence server 230, the processor 120 may control such that the external device 201 or 202 operates depending on contents the user utters. The input device 150 may include a microphone which receives an utterance of the user. The processor 120 may transmit the input voice to the intelligence server 230 via the communication module 190.

In an embodiment, the intelligence server 230 may perform natural language processing of converting a natural language in the form of text into a mechanical language. The intelligence server 230 may convert the received voice input into text data. The intelligence server 230 may syntactically or semantically analyze the text data to identify an intention of the user. The intelligence server 230 may map the intention of the user to a specified path rule set to generate an operation path. The intelligence server 230 may control such that a target device and/or the electronic device 101 operates based on contents of a voice input, that is, operates according to a sequence of states.

Figure 3:
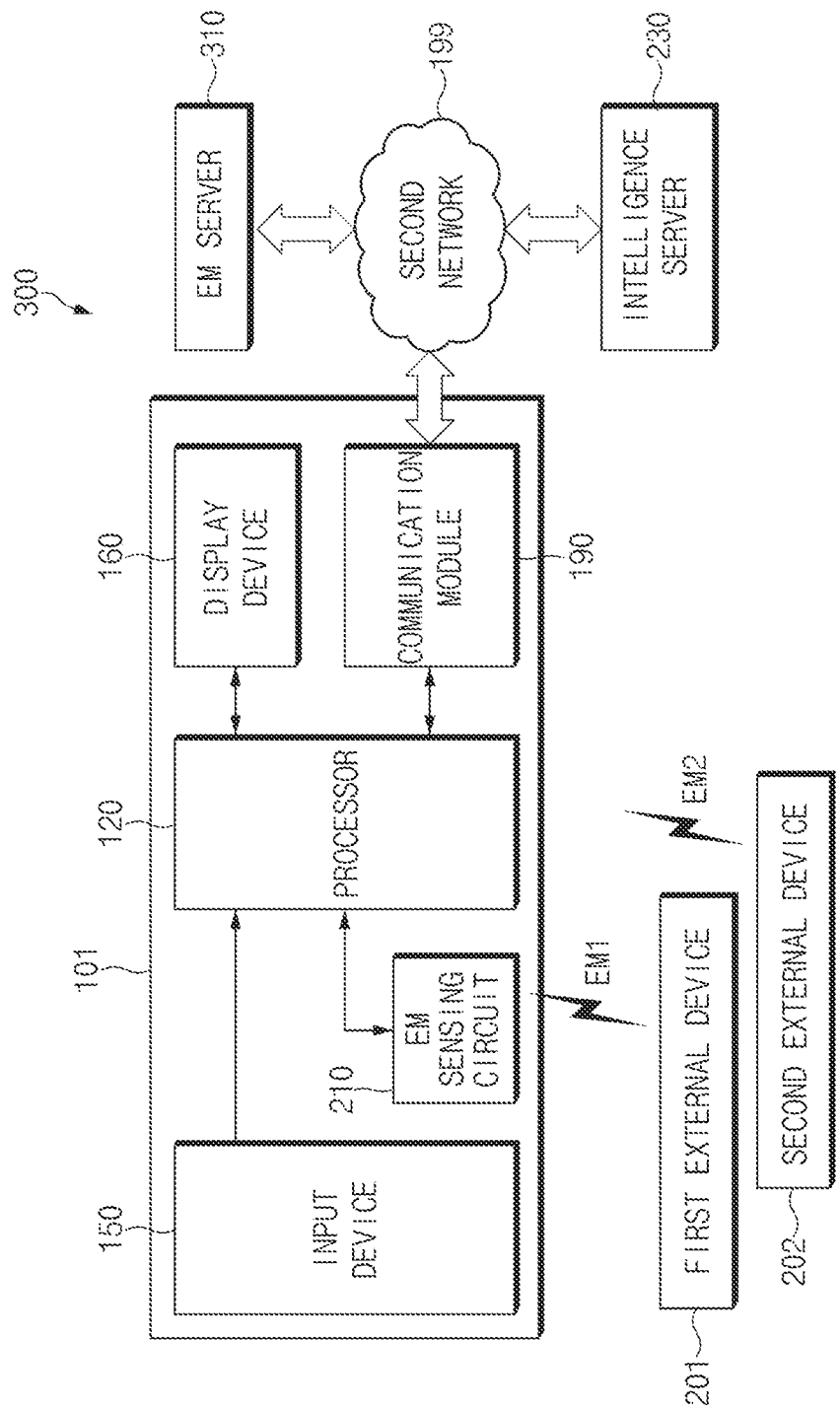
FIG. 3 is a block diagram illustrating an electronic device for obtaining an EM signal according to another embodiment.

FIG. 3 is a block diagram 300 illustrating an electronic device 101 for obtaining an EM signal EM1 or EM2 according to another embodiment.

In an embodiment, the electronic device 101 may transmit EM signal data generated by obtaining an EM signal EM1 or EM2 at an EM sensing circuit 210 to an EM server 310 having information associated with an external device 201 or 202. A processor 120 may control to transmit the EM signal data to the EM server 310 via a communication module 190. The electronic device 101 may transmit feature data among the EM signal data to the EM server 310. The EM server 310 may receive the feature data. The EM server 310 may analyze the feature data based on information associated with an external device 201 or 202. The EM server 310 may transmit the result of analyzing the feature data to the electronic device 101. The electronic device 101 may receive the result of analyzing the feature data from the EM server 310 via the communication module 190.

In an embodiment, the electronic device 101 may receive the information associated with the external device 201 or 202, included in the feature data, from the EM server 310. For example, the feature data may include information about a type and a model name of the external device 201 or 202. The electronic device 101 may receive information analyzing a type and a model name of the external device 201 or 202 from the EM server 310.

Figure 4:
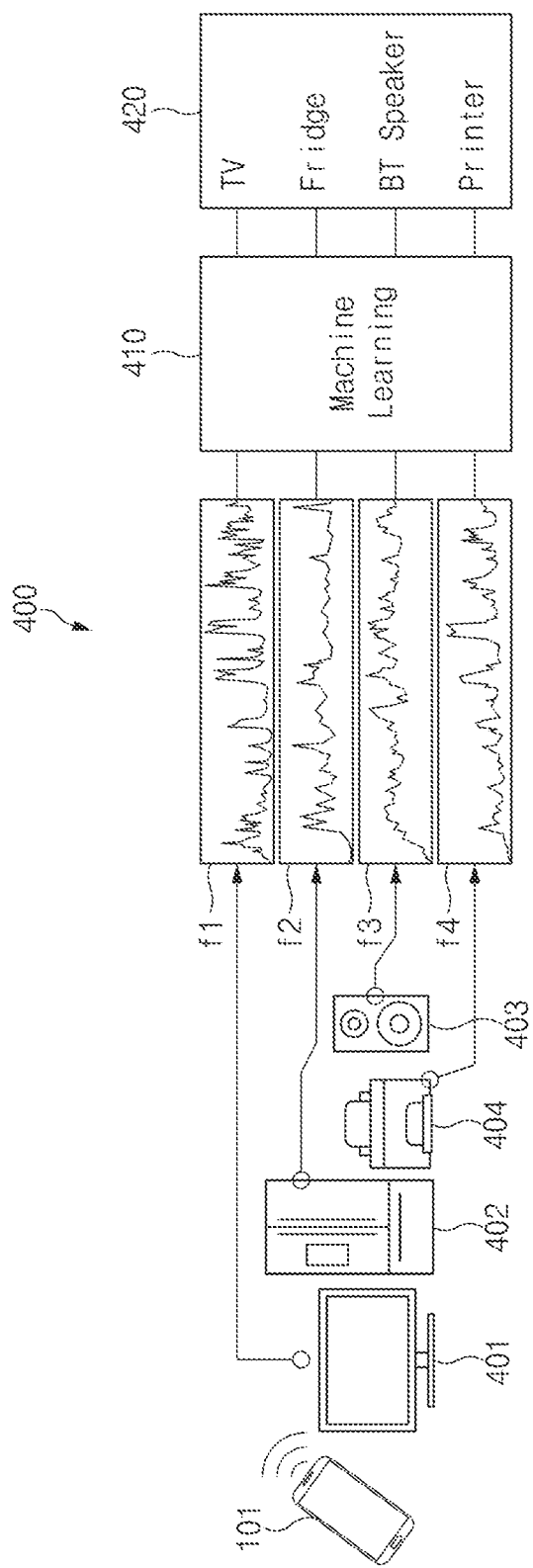
FIG. 4 is a conceptual diagram where an electronic device identifies external devices using an EM signal according to an embodiment.

FIG. 4 is a conceptual diagram 400 where an electronic device 101 identifies external devices 401, 402, 403, or 404 using an EM signal according to an embodiment.

In an embodiment, a plurality of external devices 401, 402, 403, or 404 may be arranged around the electronic device 101. For example, a TV 401, a fridge 402, a BT speaker 403, or a printer 404 may be arranged around the electronic device 101. Each of the plurality of external devices 401, 402, 403, or 404 may emit various EM signals by electromagnetic interference (EMI) generated from various electronic components therein. The emitted EM signals may include a plurality of unique signals f1, f2, f3, or f4 within a set frequency range. The electronic device 101 may obtain EM signals in a specific frequency band among the EM signals. For example, the electronic device 101 may obtain EM signals in a frequency band less than or equal to about 1 MHz by an EM sensing circuit 210.

In an embodiment, when accessing any one of the plurality of external devices 401, 402, 403, or 404, the electronic device 101 may detect an EM signal by means of the EM sensing circuit 210. The electronic device 101 may apply and identify (420) the detected EM signal to machine learning 410.

Figure 5:
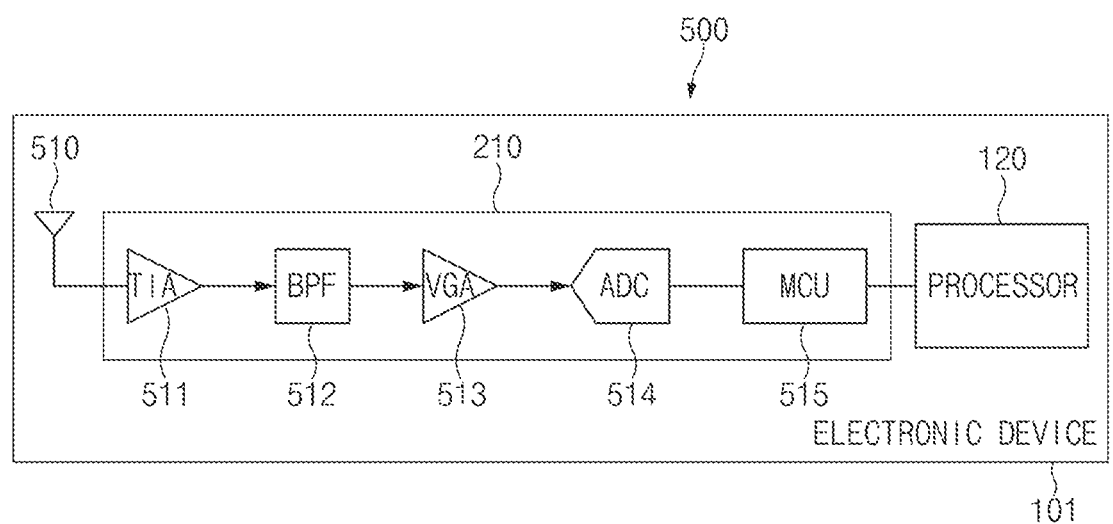
FIG. 5 is a block diagram illustrating components for performing EM sensing in an electronic device according to an embodiment.

FIG. 5 is a block diagram 500 illustrating components for performing EM sensing in an electronic device 101 according to an embodiment.

In an embodiment, the electronic device 101 may include an EM detector 510 for detecting an EM signal and an EM sensing circuit 210 for analyzing the detected EM signal. According to an embodiment a processor 120 of the electronic device 101 may identify an external device using detection information provided from the EM sensing circuit 210.

In an embodiment, the EM sensing circuit 210 may include a trans-impedance amplifier (TIA) 511, a band pass filter (BPF) 512, a variable gain amplifier (VGA) 513, an analog digital converter (ADC) 514, and a micro controller unit (MCU) 515.

In an embodiment, the TIA 511 may amplify a frequency less than or equal to about 1 MHz received from the EM detector 510. The BPF 512 may pass a frequency component defining a characteristic pattern in the signal amplified and received from the TIA 511 and may filter noise which is a frequency component not associated with the characteristic pattern. According to an embodiment, the BPF 512 may pass a frequency component less than or equal to about 1 MHz in the EM signal and may cut off a frequency component greater than about 1 MHz.

In an embodiment, to improve a noise characteristic of the filtered signal and an external interference signal cancellation characteristic, the VGA 513 may output a signal at a constant level throughout a predetermined gain range. According to an embodiment the ADC 514 may convert the analog signal provided from the VGA 513 into a digital signal and may provide the MCU 515 with the digital signal.

In an embodiment, the MCU 515 may compare the EM signal converted into the digital signal with a waveform table stored in the electronic device 101 to identify an external device. For example, the MCU 515 may compare a maximum amplitude of the EM signal and a waveform form of the EM signal with a plurality of waveforms stored in the waveform table. The MCU 515 may provide the processor 120 of the electronic device 101 with the identified information. As another example, the MCU 515 may directly provide the processor 120 of the electronic device 101 with the provided identified information. In this case, the operation of identifying the target device using the waveform comparison may be performed by the processor 120.

Figure 6:
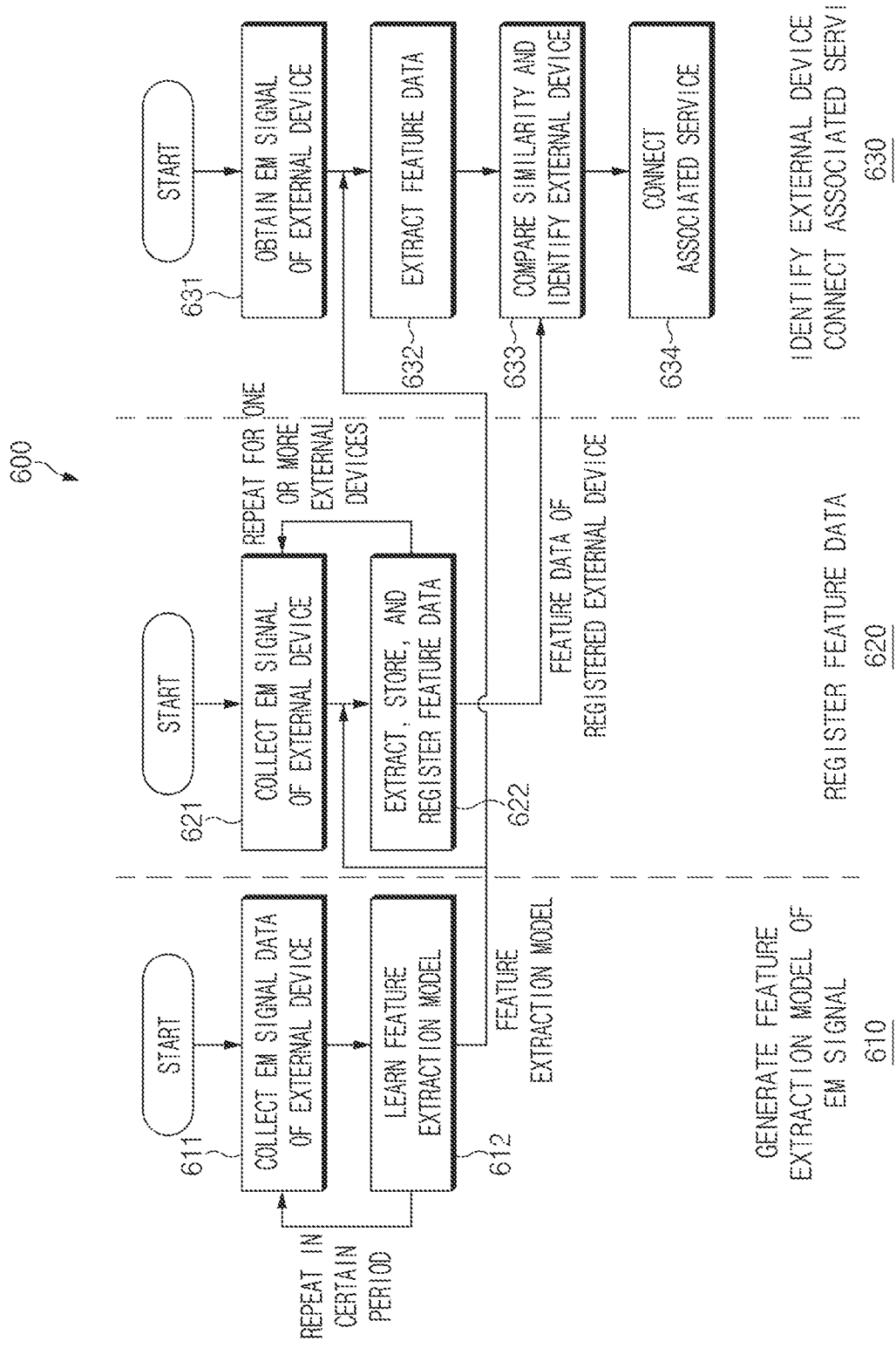
FIG. 6 is a drawing illustrating a method for registering a feature of an EM signal and identifying an external device according to an embodiment.

FIG. 6 is a drawing 600 illustrating a method for registering a feature of an electromagnetic (EM) signal and identifying an external device according to an embodiment. The EM signal may be a unique electromagnetic signal generated by an external device. The external device may be an electric device or an electronic device (e.g., a first external device 201 of FIG. 2, a second external device 202 of FIG. 2, or a plurality of external devices 401, 402, 403, or 404 of FIG. 4) around the electronic device 101. For example, the external device may be a speaker or a TV located in the same user space as the electronic device 101, for example, a house or an office. The electronic device 101 may obtain an EM signal generated by the external device.

In operation 610, the electronic device 101 or a server 108 according to an embodiment may generate a model extracting a feature of an EM signal. Operation 610 may include operation 611 and operation 612.

In operation 611, the electronic device 101 or the server 108 according to an embodiment may collect data associated with an EM signal of the external device. For example, the electronic device 101 may be configured to collect the EM signal of the external device. For another example, the electronic device 101 may be configured to transmit the obtained EM signal to the server 108 such that the server 108 collects the EM signal. The electronic device 101 or the server 108 may construct learning data generating and/or updating a feature extraction model using the collected EM signal. The feature extraction model may be a model which extracts a physical feature of each of EM signals obtained from a plurality of external devices. The electronic device 101 may classify each of the EM signals using the feature extraction model. For example, the electronic device 101 may analyze an amplitude, a phase, and/or a waveform of each of the EM signals to distinguish each EM signal. Thus, the electronic device 101 may continuously learn the feature extraction model while generating and/or updating the feature extraction model to correspond to an external device corresponding to each of the EM signals. Learning data may include a list of the EM signals collected from the plurality of external devices and/or waveform information.

In operation 612, the electronic device 101 according to an embodiment may learn the feature extraction model. The electronic device 101 or the server 108 may extract a feature to identify an external device among features the obtained EM signal has. The electronic device 101 or the server 108 may learn the feature extraction model for the EM signal, using the learning data. For example, the server 108 may separately extract a feature necessary to identify an external device using the learning data. For another example, under of control of the server 108, the electronic device 101 which collects the learning data may participate in learning the model.

In an embodiment, the electronic device 101 or the server 108 may repeat operation 611 and operation 612 in a certain period. The electronic device 101 or the server 108 may extract a feature of the EM signal of each of the plurality of external devices to generate a feature extraction model.

In an embodiment, the electronic device 101 or the server 108 may apply the generated feature extraction model to the electronic device 101. When the learning of the feature extraction model is completed, the generated feature extraction model may be downloaded from the server 108 to the electronic device 101. For example, the electronic device 101 may download a device registration application and/or a data base (DB) to which the generated feature extraction model is applied from the server 108.

In operation 620, the electronic device 101 according to an embodiment may register feature data. Operation 620 may include operation 621 and operation 622. The electronic device 101 may collect an EM signal for registering the feature data. The electronic device 101 may apply the collected EM signal to the feature extraction model to extract the feature data. The electronic device 101 may associate, store, and register the extracted feature data with the corresponding external device.

In operation 621, the electronic device 101 according to an embodiment may collect an EM signal of the external device. The electronic device 101 may obtain an EM signal of the adjacent external device. For example, by bring the electronic device 101 close to an external device to be registered or tagging the electronic device 101 to the external device, the electronic device 101 may obtain an EM signal of the corresponding external device.

In operation 622, the electronic device 101 according to an embodiment may extract, store, and register the feature data. The electronic device 101 may pass the obtained EM signal through the feature extraction model applied to the electronic device 101 to extract feature data for the corresponding external device. The electronic device 101 may store and register the extracted feature data by allowing the extracted feature data to correspond to the corresponding external device.

In an embodiment, the electronic device 101 may repeat operation 621 and operation 622 for one or more external devices. The electronic device 101 may extract feature data of each of the one or more external devices. The electronic device 101 may store and register the plurality of external devices and a plurality of feature data by allowing the plurality of feature data to correspond one-to-one to the plurality of external devices.

In operation 630, the electronic device 101 according to an embodiment may identify the external device to connect an associated service. Operation 630 may include operations 631 to 634. The electronic device 101 may obtain an EM signal from any external device for connecting the service. The electronic device 101 may apply the obtained EM signal to the feature extraction model to extract feature data. The electronic device 101 may compare the extracted feature data with the registered feature data to identify any external device. The electronic device 101 may connect the associated service with the identified external device.

In operation 631, the electronic device 101 according to an embodiment may obtain an EM signal of the external device. The electronic device 101 may obtain an EM signal from the any external device. For example, by bringing the electronic device 101 close to the external device, the electronic device 101 may obtain an EM signal of the corresponding external device.

In operation 632, the electronic device 101 according to an embodiment may extract feature data. The electronic device 101 may pass the obtained EM signal through the feature extraction model to extract feature data for the corresponding external device.

In operation 633, the electronic device 101 according to an embodiment may compare similarity to identify the external device. The electronic device 101 may compare a similarity between the feature data extracted in operation 232 with the feature data registered in operation 222. The electronic device 101 may identify any external device as an external device corresponding to the most similar feature data among the registered feature data based on the comparison of the similarity. For example, the electronic device 101 may identify that any external device has the same type and model name as the external device corresponding to the most similar feature data.

In operation 634, the electronic device 101 according to an embodiment may connect an associated service. The electronic device 101 may connect the associated service based on information it has about the identified external device. The electronic device 101 may execute the associated service with the identified external device.

Figure 7:
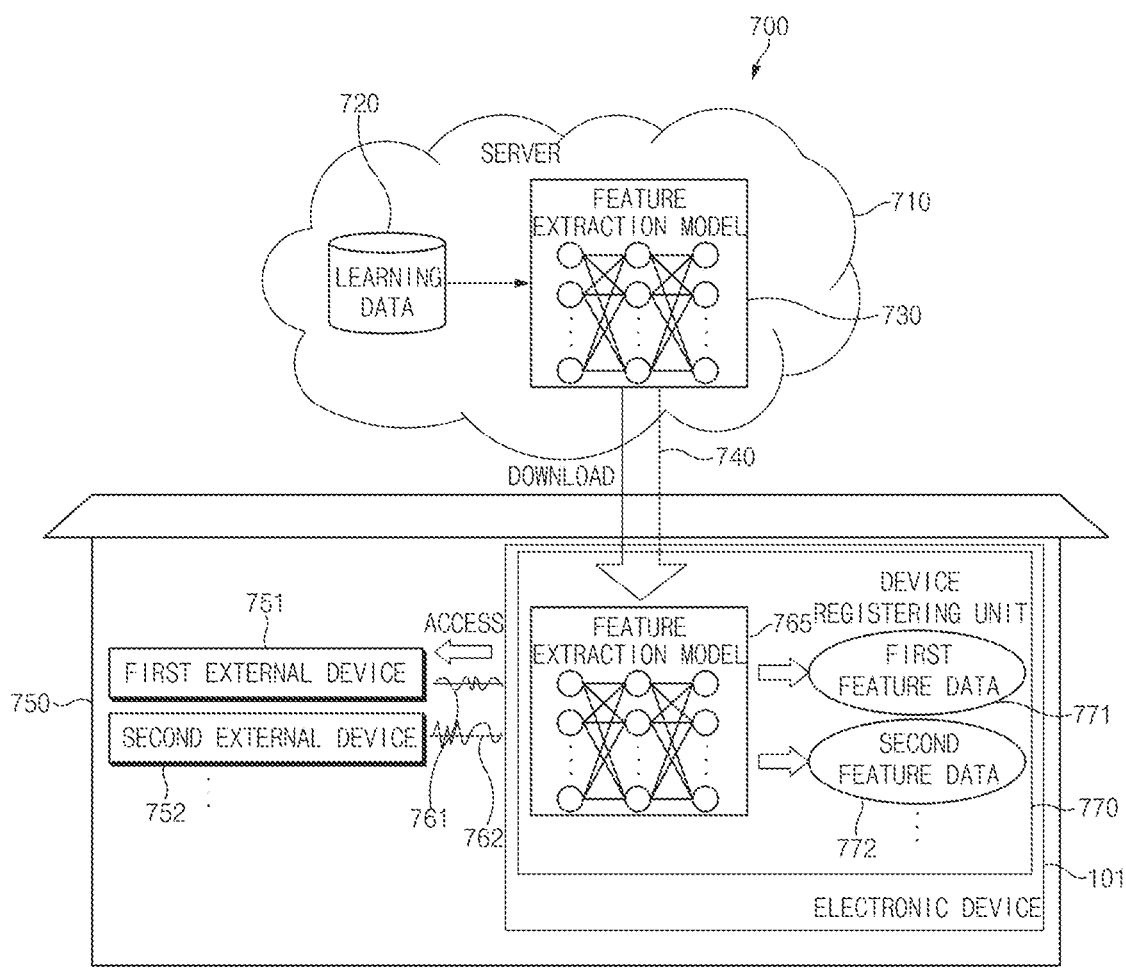
FIG. 7 is a drawing illustrating a method for registering a feature of an EM signal according to an embodiment.

FIG. 7 is a drawing 700 illustrating a method for registering a feature of an EM signal according to an embodiment.

A server 710 according to an embodiment may construct learning data 720. To generate a feature extraction model 730, collecting EM signals 761 and 762 of external devices 751 and 752 and constructing the learning data 720 should be performed in advance. The server 710 may collect the EM signals 761 and 762 of the external devices 751 and 752 to construct the learning data 720.

In an embodiment, the learning data 720 may have any one of type 1 or type 2. Type 1 may be data in a form where there is information about an EM signal and where there is a tag about whether the corresponding signal belongs to a certain device, and type 2 may be data in a form where there is only the information about the EM signal and where there is no tag. Type 1 may be data having a form of (an EM signal, an external device name). For example, type 1 may be data of (xi, yi), where i is greater than or equal to 1 or is less than or equal to N. xi may be an i-dimensional real number vector corresponding to an EM signal (e.g., the first EM signal 761 or the second EM signal 762). i dimension may refer to a complex degree of a data structure in a digital space. yi may be an integer corresponding to a type or a model name of an external device. N may be the number of the learning data 720. Type 2 may have a form of (an EM signal). For example, type 2 may be data of (xi), where i is greater than or equal to 1 or is less than or equal to N.

In an embodiment, the server 710 may extract a feature having a dimension lower than the i dimension from the learning data 720 including the i-dimensional real number vector to generate a feature extraction model 730. The server 710 may extract a feature necessary to identify an external device (e.g., the first external device 751 or the second external device 752) while changing the learning data 720 to a dimension lower than the i dimension.

In an embodiment, when using the learning data 720 of type 1, it may be more advantageous than the learning data 720 of type 2 in terms of a selection width or performance of an algorithm when generating a feature extraction model 730. However, the learning data 720 of type 1 may incur relatively more cost to be collected and managed. On the other hand, when using the learning data 720 of type 2, it may incur relatively less cost to collect and manage the learning data 720. The server 710 may generate the feature extraction model 730 using the learning data 720 of type 1 or type 2.

In an embodiment, the electronic device 101 may download (740) the feature extraction model 730 from the server 710. The electronic device 101 may store the downloaded (740) feature extraction model 730 in a device registering unit 770. The device registering unit 770 may be included in an application 146 of FIG. 1. The device registering unit 770 may be a device registration application.

In an embodiment, the electronic device 101 may be in the same user space 750 as the first external device 751 and the second external device 752. The electronic device 101 may access the first external device 751 or the second external device 752. The electronic device 101 may obtain the first EM signal 761 emitted from the first external device 751 or the second EM signal 762 emitted from the second external device 752.

In an embodiment, the device registering unit 770 of the electronic device 101 may apply the first EM signal 761 or the second EM signal 762 obtained from the first external device 751 or the second external device 752 to the downloaded (740) feature extraction model 765. The device registering unit 770 may extract first feature data 771 from the first EM signal 761 or may extract second feature data 772 from the second EM signal 762. The device registering unit 770 may store the first feature data 771 and the second feature data 772 together with information associated with the corresponding external device. For example, when the first feature data 771 is generated from a speaker and when the second feature data 772 is generated from a TV, the device registering unit 770 may register the first feature data as feature data associated with the speaker and may register the second feature data as feature data associated with the TV.

Figure 8:
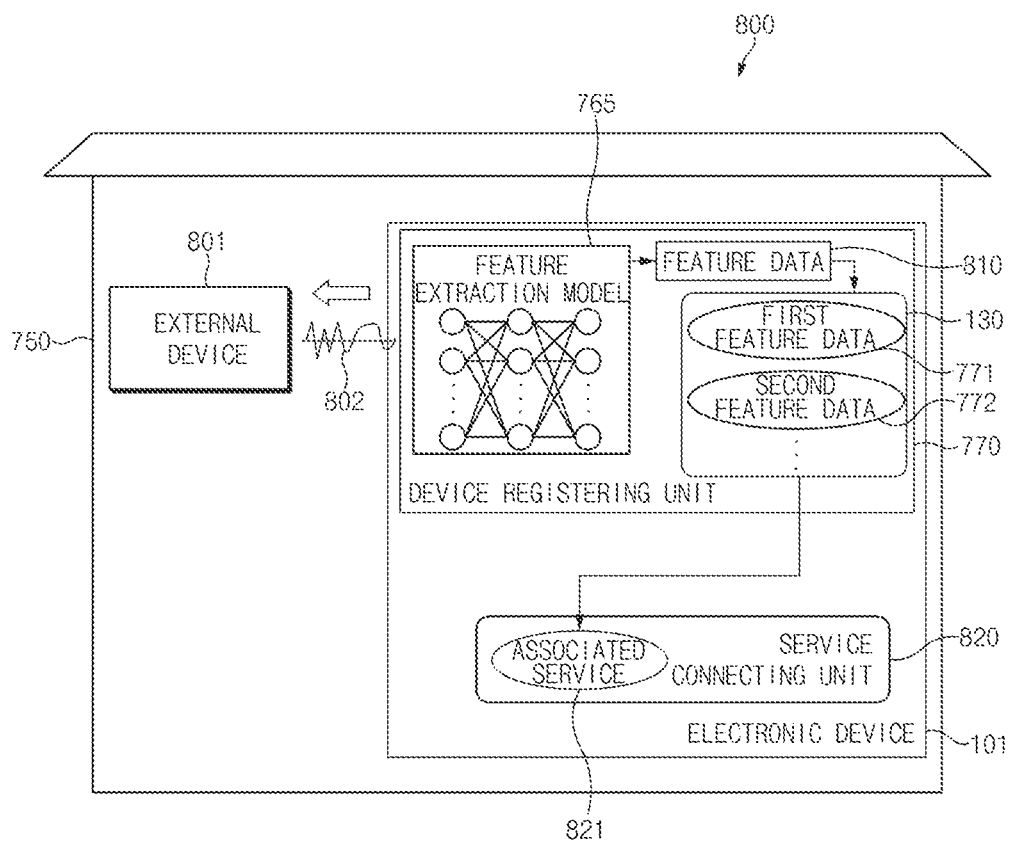
FIG. 8 is a drawing illustrating a method for identifying an external device in an electronic device according to an embodiment.

FIG. 8 is a drawing 800 illustrating a method for identifying an external device in an electronic device 101 according to an embodiment.

In an embodiment, the electronic device 101 may obtain an EM signal 802 of an external device 801. When bringing the electronic device 101 close to the external device 801 or tagging the electronic device 101 to the external device 801, the electronic device 101 may obtain the EM signal 802 of the corresponding external device 801.

In an embodiment, a device registering unit 770 of the electronic device 101 may extract a feature of the EM signal 802. The device registering unit 770 may pass the obtained EM signal 802 through a feature extraction model 765 downloaded by the electronic device 101 to extract feature data 810.

In an embodiment, the electronic device 101 may identify the external device 801. The device registering unit 770 of the electronic device 101 may calculate a similarity between the feature data 810 and registered feature data (e.g., the first feature data 771 or the second feature data 772). The similarity between the feature data and the registered feature data 771 or 772 may be calculated according to a predetermined condition. For example, when applying a cosine similarity, the similarity between the feature data 810 (v1) and the registered feature data 771 or 772 (v2) may be calculated as the following formula.

Similarity=($v1 \times v2$)/($|v1| \times |v2|$)

In an embodiment, the electronic device 101 may identify the external device 801 as a device corresponding to the feature data with the highest similarity with the feature data 810 between the registered feature data 771 and 772. For example, when the similarity between the feature data 810 and the first feature data 771 is 0.9 and when the similarity between the feature data 810 and the second feature data 772 is 0.5, the device registering unit 770 of the electronic device 101 may identify the external device 801 as an external device (e.g., a speaker) corresponding to the first feature data 771.

In an embodiment, the device registering unit 770 of the electronic device 101 may deliver identification information of the external device 801 to a service connecting unit 820. The device registering unit 770 may be a kind of application 146 of FIG. 1. The device registering unit 770 may be stored in a memory 130. For example, the device registering unit 770, the first feature data 771, and/or the second feature data 772 may be included in the memory 130, and the first feature data 771 and/or the second feature data 772 may be loaded and used from the device registering unit 770. The service connecting unit 820 may connect an associated service 821 using the identification information. When the external device 801 is identified, the electronic device 101 may connect and execute the associated service 821 based on a predetermined rule. For example, when identifying the speaker which is the external device 801 in a state of listening to music by means of the electronic device 101, the electronic device 101 may connect the corresponding speaker such that the corresponding speaker executes the listening music. As another example, the electronic device 101 may register an electronic lock of a front door of a user's house with the external device 801. Thereafter, when the electronic device 101 tags the electronic lock, it may set and use a rule of remotely controlling to turn off power sources of all Internet of things (IoT) in the house. According to an embodiment, the service connecting unit 820 may be a kind of application 146 of FIG. 1.

Figure 9:
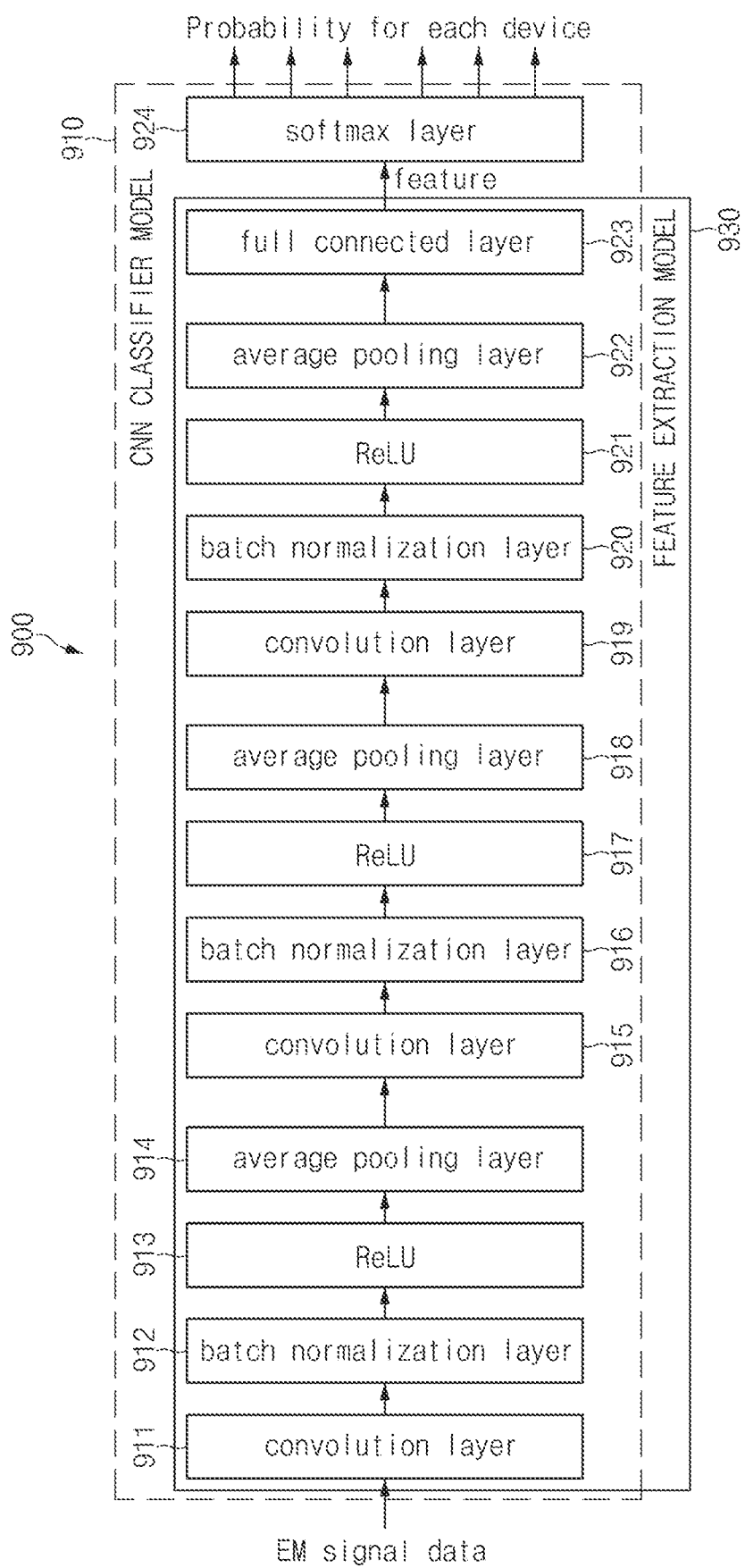
FIG. 9 is a drawing illustrating a feature extraction model according to an embodiment.

FIG. 9 is a drawing 900 illustrating a feature extraction model 903 according to an embodiment.

In an embodiment, a server (e.g., a server 710 of FIG. 7) may generate a feature extraction model 930 based on a supervised learning method. To apply the supervised learning method, a server 710 may use learning data 720 of type 1 where there is information about an EM signal and where there is a tag about whether the corresponding signal belongs to a certain device. A machine learning model capable of applying the supervised learning method is a model such as a deep neural network (DNN) or a convolutional neural network (CNN). In FIG. 9, it is exemplified as using a CNN classifier model 910.

In an embodiment, the CNN classifier model 910 may receive obtained EM signal data. The CNN classifier model 910 may repeatedly apply the input EM signal data to convolution layers 911, 915, and 919, batch normalization layers 912, 916, and 920, rectified linear units (ReLUs) 913, 917, and 921, and average pooling layers 914, 918, and 922. The CNN classifier model 910 may extract features of EM signal data while repeatedly applying the convolution layers 911, 915, and 919, the batch normalization layers 912, 916, and 920, and the ReLUs 913, 917, and 921.

In an embodiment, the CNN classifier model 910 may pass data repeatedly applying the convolution layers 911, 915, and 919, the batch normalization layers 912, 916, and 920, and the ReLUs 913, 917, and 921 through a full connected layer 923. The full connected layer 923 may combine all features previously processed by the CNN classifier model 910 to output feature data.

In an embodiment, a softmax layer 924 may be a layer applying a softmax function indicating a probability that the input will belong to certain classification. The softmax layer 924 may be a layer applying a function of performing category classification. The softmax layer 924 may be a layer performing the final operation of the CNN classifier model 910. The softmax layer 924 may calculate a probability for each device based on the feature data.

In an embodiment, the server 710 may configure the CNN classifier model 910 which outputs reliability for each external device by using the EM signal as an input. The reliability may refer to a probability that the corresponding EM signal will be output from the corresponding external device. The server 710 or the electronic device 101 may learn the CNN classifier model 910 using learning data (e.g., learning data 720 of FIG. 2). The server 710 or the electronic device 101 may generate the other portion in which the softmax layer 924 is removed from the CNN classifier model 910, the learning of which is ended, as the feature extraction model 930.

Figure 10:
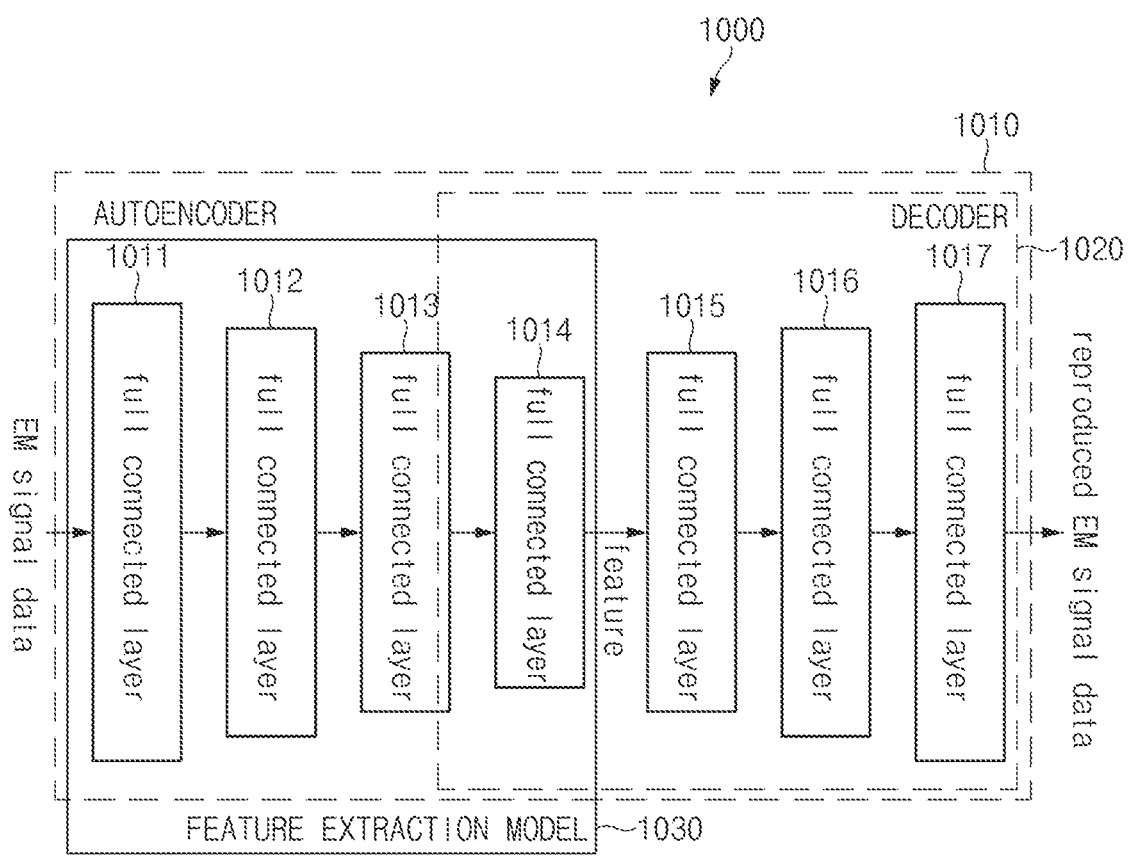
FIG. 10 is a drawing illustrating a feature extraction model according to another embodiment.

FIG. 10 is a drawing 1000 illustrating a feature extraction model 1030 according to another embodiment.

In an embodiment, a server (e.g., a server 710 of FIG. 7) may generate the feature extraction model 1030 based on an unsupervised learning method. A server 710 could use a learning data 720 of type 2 including information about an EM signal to apply the unsupervised learning method. A machine learning model capable of applying the unsupervised learning method is an autoencoder (AE) model 1010. The AE model 1010 may be a model which encodes the EM signal given as the input by means of an encoder and decodes it again by means of a decoder 1020.

According to an embodiment, the server 710 may learn the AE model 1010 using learning data (e.g., learning data 720 of FIG. 7). An output target of the AE model 1010 may be input EM signal data.

In an embodiment, the AE model 1010 may include a plurality of full connected layers 1011 to 1017. The full connected layers 1011 to 1014 applied until extracting feature data among the plurality of full connected layers 1011 to 1017 may configure an encoder, and the full connected layers 1014 to 1017 applied from a step of extracting feature data to outputting reproduced EM signal data may configure a decoder.

In an embodiment, the server 710 may generate the feature extraction model 1030 by leaving an encoder portion in the AE model 1010, the learning of which is ended.

In an embodiment, the server 710 may generate a feature extraction model (e.g., a feature extraction model 930 of FIG. 9 or the feature extraction model 1030) for the EM signal, using the constructed learning data 720. In FIGS. 9 and 10, a method or a model of generating the feature extraction model 930 or 1030 is illustrated. The feature extraction model 930 or 1030 may be a function of outputting a feature of an EM signal, when the EM signal is given as the input. Various machine learning methods may be used for a function of the feature extraction model 930 or 1030. For example, the server 710 may independently generate the feature extraction model 930 or 1030 by applying the machine learning method. For another example, an electronic device 101 which collects the learning data 720 may participate in at least partial learning process while the server 710 generates the feature extraction model 930 or 1030.

Figure 11A:
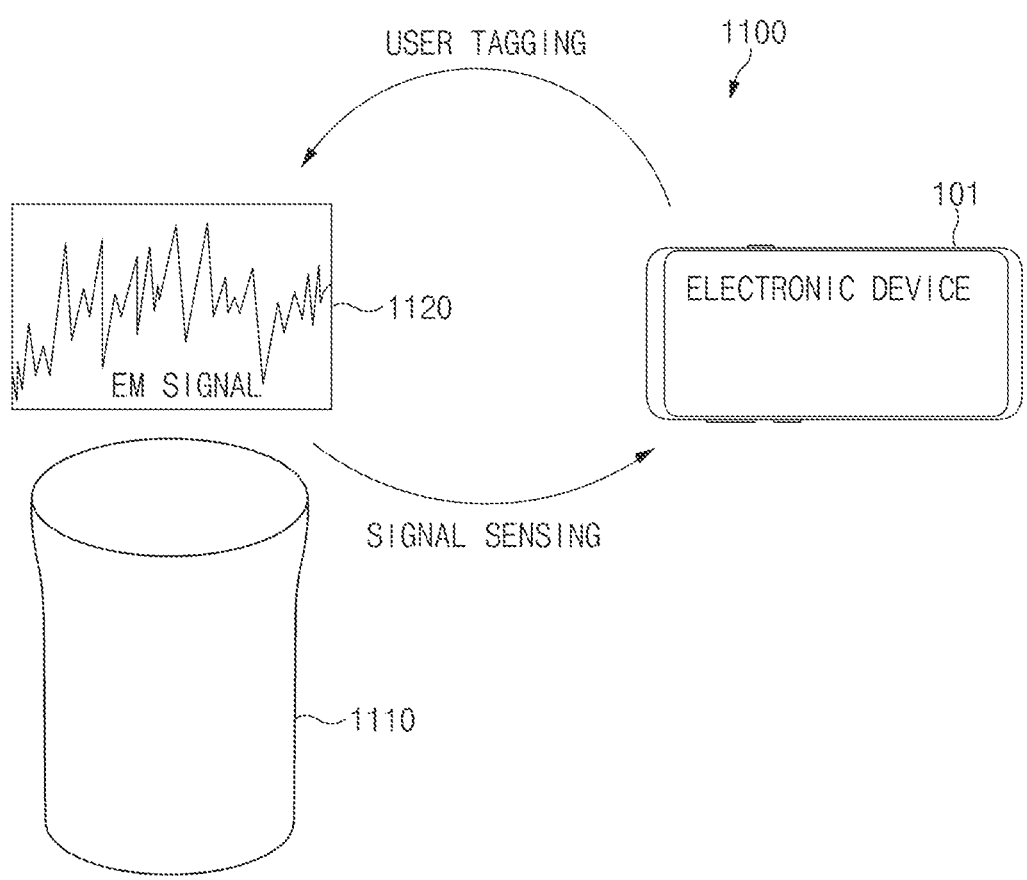
FIG. 11A is a drawing illustrating a method for obtaining an EM signal of an external device in an electronic device according to an embodiment.

FIG. 11A is a drawing 1100 illustrating a method for obtaining an EM signal 1120 of an external device 1110 in an electronic device 101 according to an embodiment.

In an embodiment, a user may obtain the EM signal 1120 of the external device 1110 by means of the electronic device 101. The user may bring the electronic device 101 close to the external device 1110 by means of a tagging operation. The electronic device 101 may obtain the EM signal 1120 generated by the external device 1110 by means of a signal sensing operation.

Figure 11B:
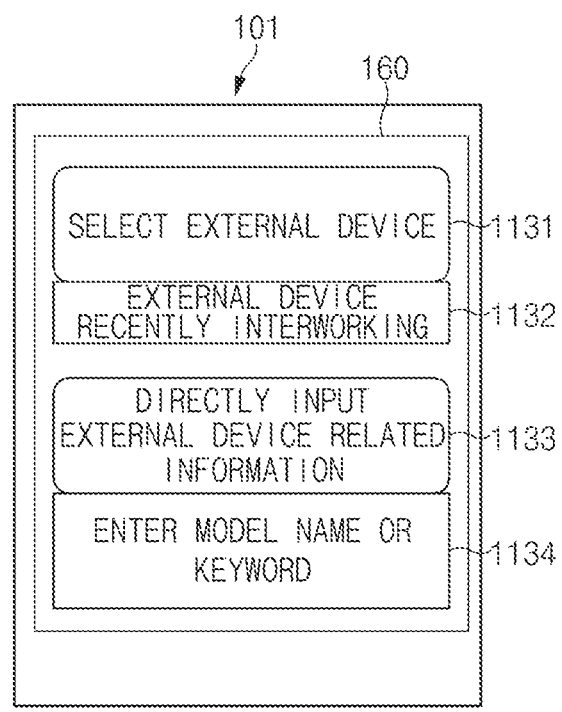
FIG. 11B is a drawing illustrating a screen which provides an input interface for inputting information associated with an external device to an electronic device according to an embodiment.

FIG. 11B is a drawing illustrating a screen which provides an input interface for inputting information associated with an external device to an electronic device according to an embodiment.

In an embodiment, an electronic device 101 may register registration information in which extracted feature data and an external device correspond to each other. For example, when there is feature data extracted from an EM signal, the registration information may be information, in which a one-to-one correspondence is performed about whether the corresponding EM signal is generated from any external device. The electronic device 101 may store the registration information in a database included in a memory 130.

In an embodiment, the electronic device 101 may provide an input interface for inputting the registration information. The electronic device 101 may display a selection window 1131 capable of selecting one or more external devices, a quick menu 1132 of displaying external devices recently interworking, a notification window 1133 of notifying a user of information to be input, and an input window 1134 capable of inputting an external device on a display device 160.

In an embodiment, the electronic device 101 may display the selection window 1131 capable of selecting the external device. When the selection window 1131 is selected, the electronic device 101 may display external devices capable of corresponding to feature data extracted from the selection window 1131.

In an embodiment, the electronic device 101 may display external devices capable of being quickly selected using the quick menu 1132. For example, the quick menu 1132 may display external devices which recently interwork with the electronic device 101. A user may select an external device to currently interwork among the external devices recently interworking.

In an embodiment, the electronic device 101 may display the notification window 1133 of notifying the user of information to be input and the input window 1134 where the user may directly input an external device. The notification window 1133 may display a guidance message of directly inputting external device related information. The notification window 1133 may display an icon and/or a symbol for inputting a model name or a keyword. The input window 1134 may display a text window in which the user may directly input an external device. On the input window 1134, the user may directly enter at least a portion of a model name or a keyword of the external device using an input means such as a keyboard or voice utterance. The input window 1134 may display a guidance message for inputting a model name or a keyword.

Figure 11C:
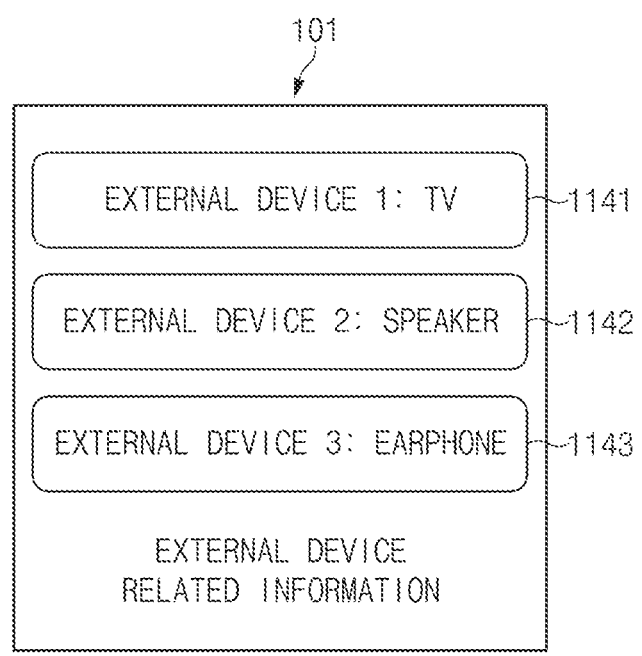
FIG. 11C is a drawing illustrating a screen which shows information associated with an external device to an electronic device according to an embodiment.

FIG. 11C is a drawing illustrating a screen which shows information associated with an external device to an electronic device 101 according to an embodiment.

In an embodiment, the electronic device 101 may show at least one previously stored information associated with the external device when registering registration information. The previously stored information associated with the external device may be registration information previously registered in a database of a memory 130.

In an embodiment, the electronic device 101 may display previously stored external devices in the form of a list or an icon while notifying that there is external device related information. The electronic device 101 may display external devices similar to the extracted feature data. For example, the electronic device 101 may display a. TV as external device 1 1141, may display a speaker as external device 2 1142, and may display an earphone as external device 3 1143.

Figure 12:
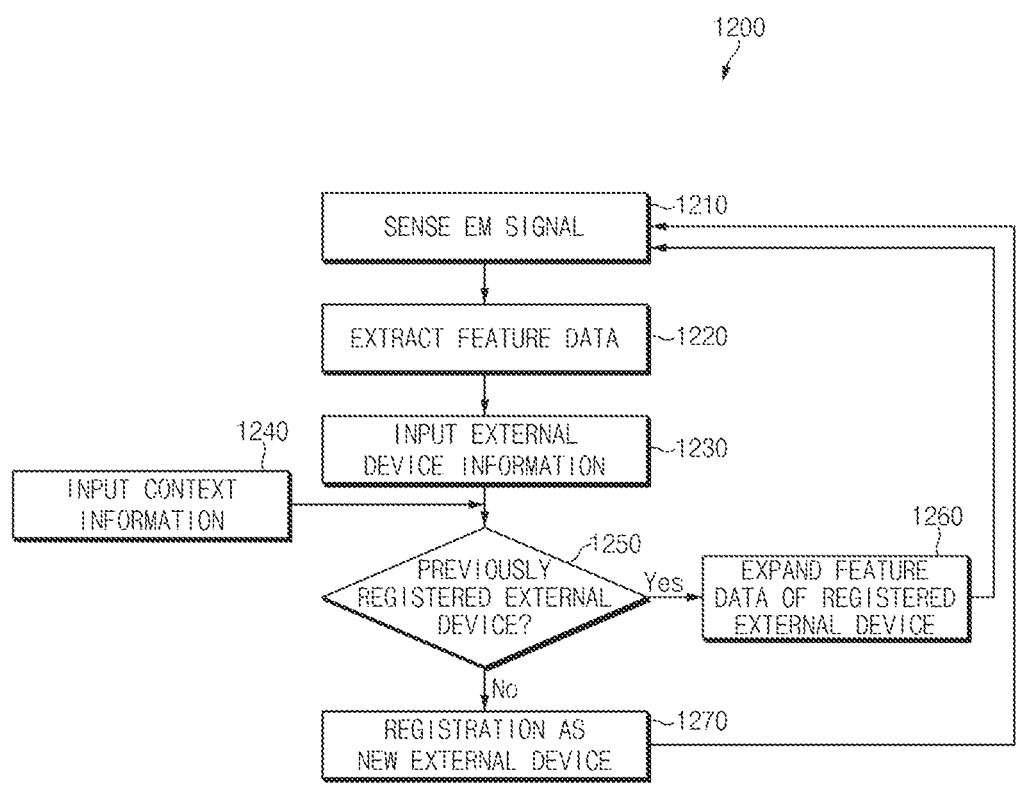
FIG. 12 is a flowchart illustrating a method for registering an external device according to an embodiment.

FIG. 12 is a flowchart 1200 illustrating a method for registering an external device 751 or 752 according to an embodiment.

In operation 1210, an electronic device 101 according to an embodiment may sense an EM signal 761 or 762. The electronic device 101 may sense the EM signal 761 or 762 of the external device 751 or 752 using an EM sensing circuit 210. For example, a user may obtain the EM signal 761 or 762 of the corresponding external device 751 or 752 by bringing the electronic device 101 close to the external device 751 or 752 to be registered or tagging the electronic device 101 to the external device 751 or 752.

In operation 1220, the electronic device 101 may extract feature data. The electronic device 101 may download a feature extraction model 730 from a server 710 to store the feature extraction model 730 in a device registering unit 770. The electronic device 101 may pass the obtained EM signal through a feature extraction model 765 stored in the device registering unit 770 to extract feature data 810.

In operation 1230, the electronic device 101 according to an embodiment may receive external device information. The electronic device 101 may store the extracted feature data 810 to correspond to information of the corresponding external device 751 or 752. The user may input device information such as a type or a model name of the corresponding external device 751 or 752. The electronic device 101 may bind and store or register the device information with feature data. The registered information may be stored in a memory 130 of the electronic device 101 and may be copied to a separate server 710 such as an IoT cloud server to be managed for each user account.

In operation 1240, the electronic device 101 according to an embodiment may receive context information. The context information may include information of a registration situation, for example, a location, surrounding environment information (e.g., external device information), or a state of the electronic device 101 such as an angle defined by the electronic device 101 and the ground. The electronic device 101 may store context information when registering the electronic device 101 together with device information input by the user.

In an embodiment, when storing and registering the context information together, the electronic device 101 may distinguish the same external device disposed in different user spaces 750. For example, when there are the same type of computers in a house and an office, which are the user spaces 750, operation environments such as connection states or power noise states of which are similar to each other, EM signals of the respective computers may be substantially the same as each other. The user is able to distinguish and register computers arranged in the house and the office in the electronic device 101. In this case, when the same type of computers located in the house and the office are registered, location information may be additionally registered as context information. When the location information is stored together with the added context information, the same type of computers located in the house and the office may be registered and used as different external devices.

In operation 1250, the electronic device 101 according to an embodiment may determine whether the external device which generates the EM signal is the previously registered external device 751 or 752. The electronic device 101 may determine whether the extracted feature data 810 includes information corresponding to the input external device information.

When the external device which generates the EM signal is the previously registered external device 751 or 752, in operation 1260, the electronic device 101 according to an embodiment may expand feature data 771 or 772 of the registered external device 751 or 752. When it is determined that the input external device information and/or the extracted feature data 810 is information generated by the registered external device 751 or 752, the electronic device 101 may store the input external device information and/or the extracted feature data 810 to use it as feature data 771 or 772 identifying the corresponding external device.

When the external device is not the previously registered external device 751 or 752, in operation 1270, the electronic device 101 according to an embodiment may register information associated with the external device. When it is determined that the input external device information and/or the extracted feature data 810 is information generated by a new external device rather than the registered external device 751 or 752 and/or the extracted feature data 810, the electronic device 101 may use the input external device information as feature data identifying the new external device.

In an embodiment, the electronic device 101 may perform repetition for the plurality of external devices 401 to 404- to register operations 1210 to 1270.

In an embodiment, the electronic device 101 may propose an external device based on a history accessing a device registered with an IOT service (e.g., SmartThings) or accessing Bluetooth/Wi-Fi, rather than when the user manually receives the information associated with the external device.

Figure 13:
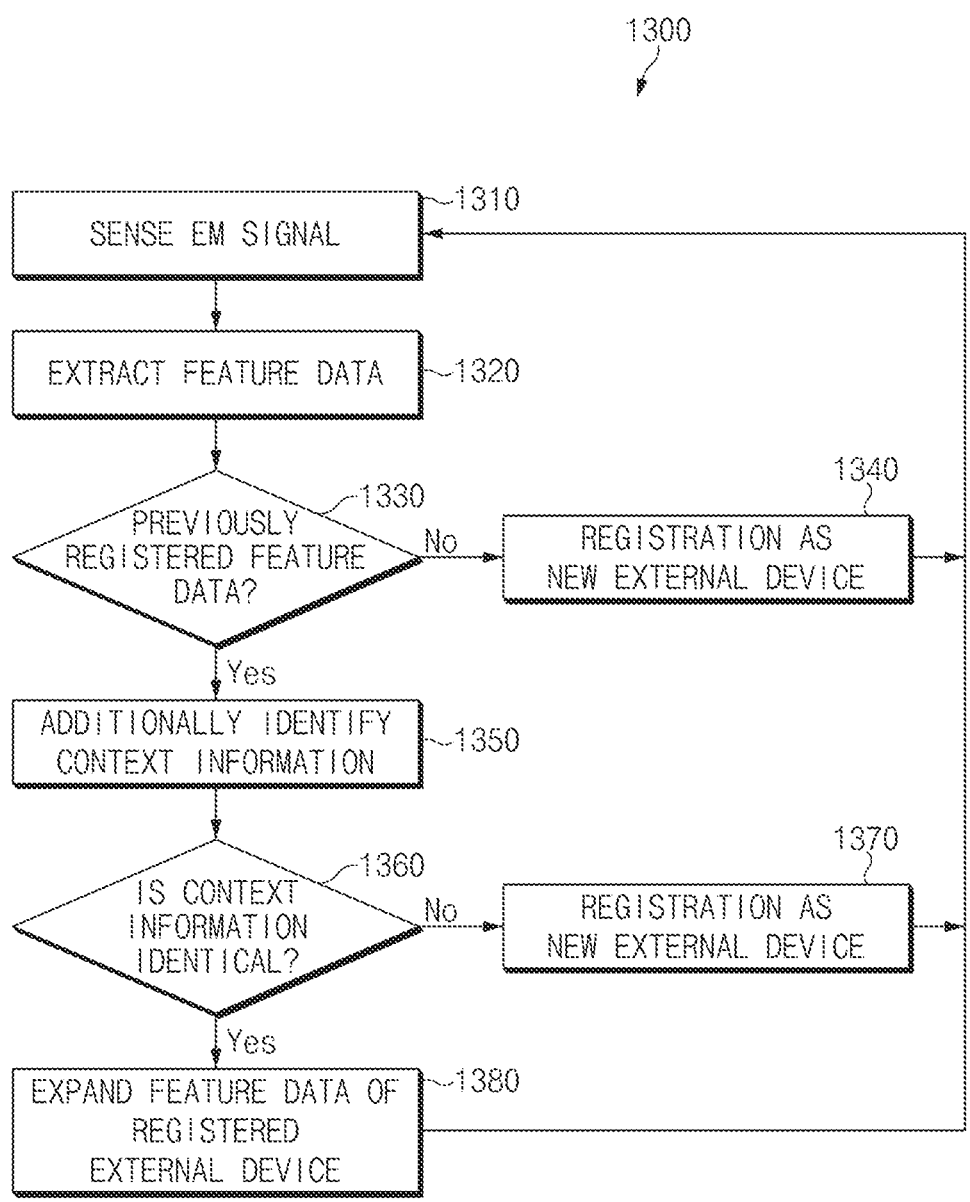
FIG. 13 is a flowchart illustrating a method for registering an external device according to another embodiment.

FIG. 13 is a flowchart 1300 illustrating a method for registering an external device 751 or 752 according to another embodiment.

In operation 1310, an electronic device 101 according to an embodiment may sense an EM signal 761 or 762. The electronic device 101 may sense the EM signal 761 or 762 of the external device 751 or 752 using an EM sensing circuit 210. For example, a user may obtain the EM signal 761 or 762 of the corresponding external device 751 or 752 by bringing the electronic device 101 close to the external device 751 or 752 to be registered or tagging the electronic device 101 to the external device 751 or 752.

In operation 1320, the electronic device 101 according to an embodiment may extract feature data 810. The electronic device 101 may, download a feature extraction model 730 from a server 710 to store the feature extraction model 730 in a device registering unit 770. The electronic device 101 may pass the obtained EM signal through the feature extraction model 730 stored in the device registering unit 770 to extract the feature data 810.

In operation 1330, the electronic device 101 according to an embodiment may determine whether the extracted feature data 810 is previously registered. The electronic device 101 may determine whether the feature data 810 extracted from the feature extraction model 730 is identical to a plurality of feature data 771 and 772 stored in a memory 130.

When the feature data is not previously registered, in operation 1340, the electronic device 101 according to an embodiment may register information associated with a new external device. The electronic device 101 may use the extracted feature data 810 as feature data identifying the new external device.

When the feature data 810 is previously registered, in operation 1350, the electronic device 101 according to an embodiment may additionally identify context information. A use form or a security level of the external device may be differently set according to the context information. Thus, although feature data extracted from the EM signal are the same as each other, they may be registered with different devices based on context information such as a location.

In operation 1360, the electronic device 101 according to an embodiment may determine whether pieces of context information are identical to each other.

When the pieces of context information are not identical to each other, in operation 1370, the electronic device 101 according to an embodiment may register information associated with the new external device. The electronic device 101 may use the extracted feature data 810 as feature data identifying the new external device.

When the pieces of context information are identical to each other, in operation 1380, the electronic device 101 according to an embodiment may expand feature data 771 or 772 of the registered external device 751 or 752. The electronic device 101 may store the input external device information and/or the extracted feature data 810 to use it as the feature data 771 or 772 identifying the corresponding external device.

Figure 14:
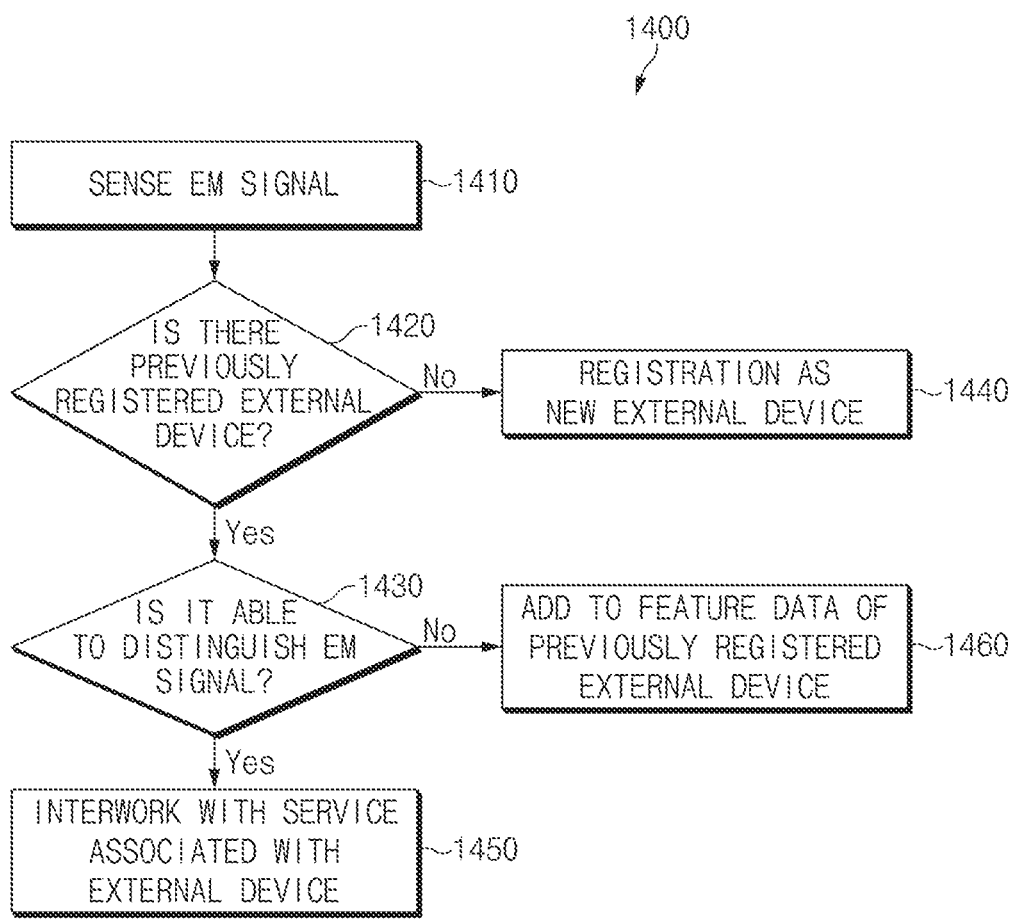
FIG. 14 is a flowchart illustrating a method for registering an external device and interworking with a service associated with the external device according to an embodiment.

FIG. 14 is a flowchart 1400 illustrating a method for registering an external device and interworking with a service associated with the external device according to an embodiment.

In operation 1410, an electronic device 101 according to an embodiment may sense an EM signal 761 or 762 from an electronic device 751 or 752 using an EM sensing circuit 210.

In operation 1420, the electronic device 101 according to an embodiment may determine whether there is a previously registered external device 751 or 752. The electronic device 101 may determine whether the sensed EM signal 761 or 762 is a signal received from the registered external device 751 or 752 or a signal received from a new external device.

When there is the previously registered external device, in operation 1430, the electronic device 101 according to an embodiment may determine whether it is able to distinguish the EM signals 761 and 762. The electronic device 101 may distinguish whether the EM signal 761 or 762 is a signal capable of being determined as being generated by the previously registered external device or a signal capable of being generated by the previously registered external device, but incapable of being accurately determined as being generated by a certain device. For example, when the EM signal 761 or 762 has a difference greater than or equal to a specified range with an EM signal generated by the previously registered external device due to a change in the operation of the external device or when the ratio of the EM signal generated by the previously registered external device to noise is greater than or equal to a specified ratio, the electronic device 101 may determine that it is unable to distinguish the EM signal because it is unable to determine whether the EM signal 761 or 762 is a signal accurately received from a certain device.

When there is no previously registered external device, in operation 1440, the electronic device 101 according to an embodiment may register information associated with a new external device. When it is determined that the obtained EM signal is the information generated by the new external device, the electronic device 101 may use the obtained EM signal to register the new external device.

When it is able to distinguish the EM signal, in operation 1450, the electronic device 101 according to an embodiment may interwork with a service associated with the external device. The electronic device 101 may identify an external device using the EM signal and may interwork with the service associated with the corresponding external device.

When it is unable to distinguish the EM signal, in operation 1460, the electronic device 101 according to an embodiment may add the EM signal to the feature data 771 or 772 of the previously registered external device 751 or 752. When it is unable to distinguish the EM signal may be when the EM signal generated by the previously registered external device 751 or 752 is modified due to a change in the operation of the external device or when noise is mixed in a process of receiving the EM signal from the previously registered external device 751 or 752. When it is unable to distinguish the obtained EM signal from an EM signal generated by the registered external device 751 or 752, the electronic device 101 may store and use the input external device information as the feature data 771 or 772 identifying the corresponding external device.

In an embodiment, the electronic device 101 may collect a plurality of EM signals for the one external device 751 and may extract and register the feature data 771. The electronic device 101 may compare a similarity between the plurality of EM signals. When the similarity between the plurality of EM signals is greater than or equal to a specified criterion, the electronic device 101 may determine whether the plurality of EM signals are received from the same external device. The electronic device 101 may register the feature data 771 extracted from the plurality of EM signals as the feature data 771 corresponding to the same external device.

In an embodiment, the electronic device 101 may notify a user that there is a difference in the EM signal by means of a related application in the step of registering the EM signal. The electronic device 101 may receive confirmation about whether to register the corresponding EM signal with a new external device in the step of registering the external device corresponding to the EM signal from the user.

In an embodiment, the electronic device 101 may provide a notification of whether to register an EM signal with one external device or another service. The electronic device 101 may display a list of old external devices and/or a menu capable of adding a new external device for the user. The user may select one in the list of the old external devices or may select the menu capable of adding the new external device. The electronic device 101 may register the corresponding EM signal with the new external device in response to the selection and/or input of the user.

In an embodiment, the electronic device 101 may interwork with the external device 751 or 752 using the method for registering and identifying the external device 751 or 752. The electronic device 101 may interwork with the external device 751 or 752 to perform various functions.

In an embodiment, the electronic device 101 may add a new rule to a user setting macro function by means of the registration and identification of the external device. The rule may be a function of performing an operation according to a condition, which may include the command "if this, then that". For example, when a condition of tagging the electronic device 101 to a speaker occurs, an operation of connecting the electronic device 101 to the speaker and changing an audio path to the speaker may be performed. For another example, when a condition of tagging the electronic device 101 to a TV, an operation of connecting the electronic device 101 to the TV, and changing a screen path to the TV or mirroring the screen of the electronic device 101 may be performed. For another example, when a condition of tagging the electronic device 101 to a door lock occurs, an operation of turning off a power source of a home IoT device such as a gas, a TV, or an air conditioner may be performed.

Figure 15:
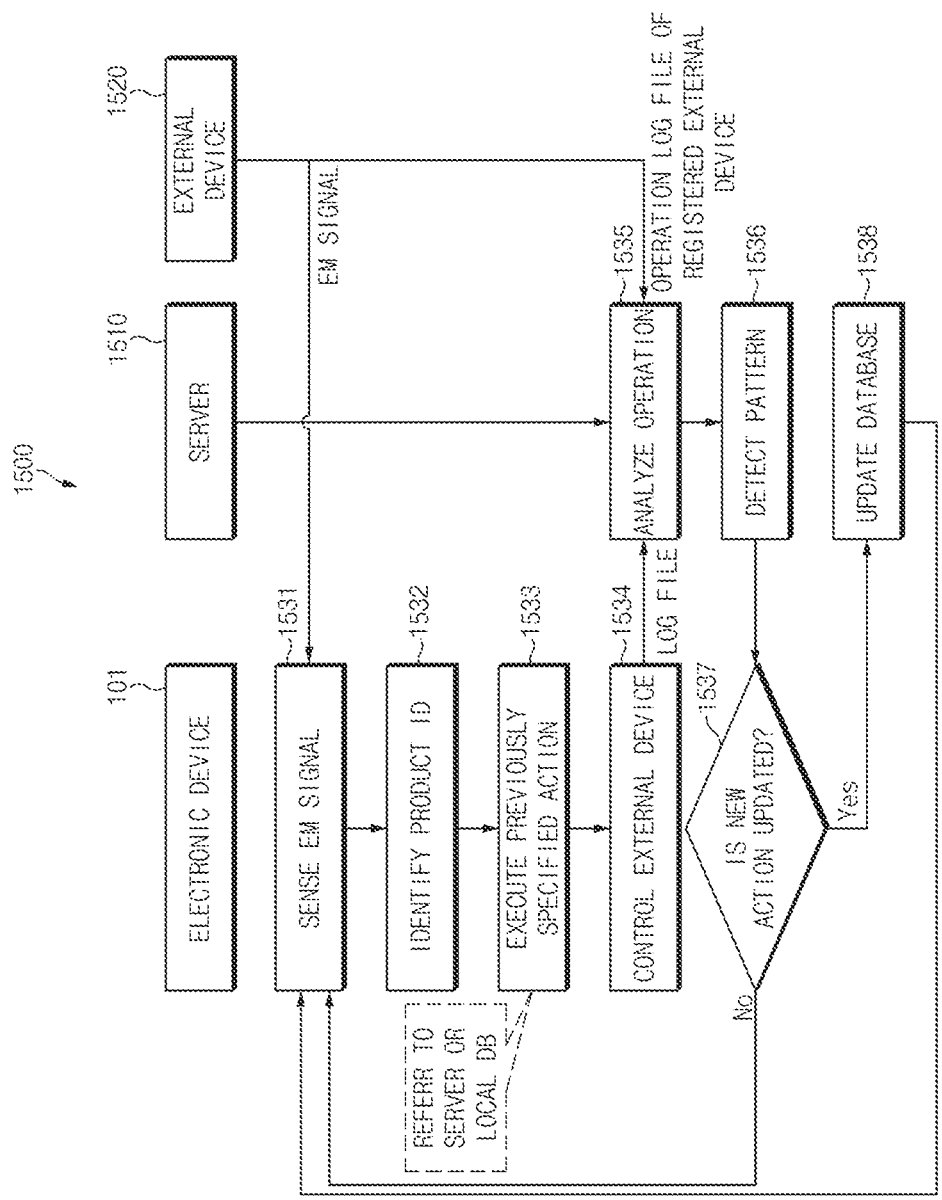
FIG. 15 is a flowchart illustrating a method for generating a rule using action pattern analysis according to an embodiment.

FIG. 15 is a flowchart 1500 illustrating a method for generating a rule using action pattern analysis according to an embodiment. In FIG. 15, it is shown that a server 1510 performs a process of analyzing an operation and generating a rule. However, it is not limited thereto, and an electronic device 101 may generates and transmit a rule to the server 1510.

In operation 1531, the electronic device 101 according to an embodiment may sense an EM signal. The electronic device 101 may obtain an EM signal generated from an external device 1520.

In operation 1532, the electronic device 101 according to an embodiment may identify a product ID of the external device 1520. The electronic device 101 may identify the product II) of the external device 1520 using the obtained EM signal.

In operation 1533, the electronic device 101 according to an embodiment may execute a previously specified action. The previously specified action may include interworking with the external device 1520 to perform various functions at the electronic device 101. Furthermore, the previously specified action may be an action of operating a plurality of home appliances, for an IoT environment. For example, the previously specified action may include an action, such as an action of connecting to a speaker and changing an audio path, an action of connecting to a TV and controlling a screen, and/or an action of collectively turning off power sources of home appliances. When executing the previously specified action, the electronic device 101 may refer to the server 1510 (e.g., a Smart Things' server) or a local database (DB).

In operation 1534, the electronic device 101 according to an embodiment may control the identified external device 1520. The electronic device 101 tray transmit a log file associated with the operation to the server 1510. For example, the log file associated with the operation may be information associated with an operation performed by the electronic device 101 after the electronic device 101 receives the EM signal from the external device 1520.

In operation 1535, the server 1510 according to an embodiment may analyze the operation. In an embodiment, the server 1510 may receive the log file from the electronic device 101 to operate the registered external device 1520. When operating the external device 1520, the server 1510 may receive an operation log file from the external device 1520. For example, when the electronic device 101 performs an action of adjusting illumination intensity of an external IoT light, the server 1510 may receive a log file about the operation of adjusting the illumination intensity of the external IoT light from the external IoT light. In another embodiment, the server 1510 may receive an operation log file from the external device 1520 controlled by the electronic device 101 or may request and receive the external device 1520 from the external device 1520, based on the log file received from the electronic device 101. The server 1510 according to an embodiment may compare the log file associated with the operation of the electronic device 101 with the operation log file of the registered external device 1520.

In operation 1536, the server 1510 according to an embodiment may detect a pattern. The pattern may have a specific form of actions included in the operation log file. For example, when a user takes an action of tagging a TV and adjusting illumination intensity of the external IoT light, the server 1510 may detect a pattern of performing remote control to adjust illumination intensity of the IoT light, when tagging the TV. The server 1510 may transmit data associated with the detected pattern to the electronic device 101.

In operation 1537, the electronic device 101 according to an embodiment may determine whether a new action is updated. The electronic device 101 may interwork with the server 1510 and/or the external device 1520 to analyze an action pattern of the user. The electronic device 101 may register the action pattern of the user as a new action with the server 1510 or may specify the action pattern of the user as a previously specified action, based on data analyzing the action pattern of the user. The electronic device 101 may determine whether the new action is updated based on the data analyzing the action pattern of the user. When the new action is not updated, the electronic device 101 may return to operation 1531.

In operation 1538, the electronic device 101 according to an embodiment may update a database of the server 1510. For example, the electronic device 101 may perform and transmit the new action to the server 1510 and may update the database of the server 1510. The database of the server 1510 may store a rule performed by the electronic device 101.

In an embodiment, the electronic device 101 may automatically generate and propose or register a rule, based on the data analyzing the action pattern of the user. For example, when a specific pattern is discovered as a result of tagging the external device and monitoring and analyzing a user action generated within a certain time at the electronic device 101, the electronic device 101 may propose or register the specific pattern as a new rule.

In an embodiment, the operation monitored by the electronic device 101 may include an operation of the external device 1520. For example, the operation where the user tags the electronic device 101 to a TV and adjusts illumination intensity of the IoT light may be stored as a log file. The electronic device 101 may find the new rule of 'performing remote control to adjust illumination intensity of the IoT light, when tagging the TV' through the corresponding log file and may propose or register the new rule to the user. Thus, the desired external device 1520 may be controlled using the electronic device 101 in an IoT environment where a plurality of external devices are connected.

A method for interworking with an external device (e.g., an external device 801 of FIG. 8) in an electronic device 101 according to various embodiments may include obtaining an EM signal (e.g., a first EM signal 761 and/or a second EM signal 762 of FIG. 7) from the external device 801, passing the obtained EM signal (761 and/or 762) through a feature extraction model (e.g., a feature extraction model 765 of FIG. 7) to extract feature data (e.g., first feature data 771 or second feature data 772 of FIG. 7), receiving information associated with the external device 801, generating registration information based on the extracted feature data 771 or 772 and the information associated with the external device 801, and storing the generated registration information in a database of a memory (e.g., a memory 130 of FIG. 1). The receiving of the information associated with the external device 801 may be providing an input interface for inputting the information associated with the external device 801 or showing at least one previously stored information associated with the external device 751 or 752.

In an embodiment, the input interface for inputting the information associated with the external device 801 may include a selection window (e.g., a selection window 1131 of FIG. 11B) capable of selecting the external device, a quick menu (e.g., a quick menu 1132 of FIG. 11B) of displaying external devices recently interworking, a notification window (e.g., a notification window 1133 of FIG. 11B) of notifying a user of information to be input, and/or an input window (e.g., an input window 1134 of FIG. 11B) capable of inputting the external device.

In an embodiment, the generating of the registration information may include receiving (e.g., operation 1240 of FIG. 12) context information including information associated with a situation, a location, and/or an environment where the registration information is generated.

In an embodiment, the method may further include comparing feature data (e.g., feature data 810 of FIG. 8) input after storing the registration information with the registration information stored in the memory 130 to identify any external device 801.

In an embodiment, the identifying of the any external device 801 may include comparing a similarity between the extracted feature data 771 or 772 and the feature data 810 of the EM signal obtained from the any external device 801.

In an embodiment, the method may further include generating the feature extraction model 765. The generating of the feature extraction model 765 may include previously collecting an EM signal 761 or 762 of at least one device (e.g., the first external device 751 or the second external device 752 of FIG. 7) and constructing learning data (e.g., learning data 720 of FIG. 7). The learning data 720 may include type 1 in a form where there is information about the EM signal 761 or 762 and where there is a tag displaying whether the EM signal 761 or 762 is generated from the certain external device 751 or 752 or type 2 where there is only the information about the EM signal 761 or 762.

In an embodiment, the feature extraction model (e.g., a feature extraction model 965 of FIG. 9) may be generated based on a supervised learning method. The supervised learning method may include a CNN classifier model (e.g., a CNN classifier model 910 of FIG. 9).

In an embodiment, the feature extraction model (e.g., a feature extraction model 1030 of FIG. 10) may be generated based on an unsupervised learning method. The unsupervised learning method may include an autoencoder (e.g., an autoencoder 1010 of FIG. 10) model.

An electronic device 101 according to various embodiments may include an input device (e.g., an input device 150 of FIG. 2), a display device (e.g., a display device 160 of FIG. 2), a communication module (e.g., a communication module 190 of FIG. 2), an EM sensing circuit (e.g., an EM sensing circuit 210 of FIG. 2) for obtaining an EM signal (e.g., a first EM signal EM1 or a second EM signal EM2 of FIG. 2), at least one processor (e.g., a processor 120 of FIG. 2) operationally connected with the input device 150, the display device 160, the communication module 190, and the EM sensing circuit 210, and a memory (e.g., a memory 120 of FIG. 2) operationally connected with the processor 120. The memory 130 may store instructions, when executed, causing the processor 120 to obtain an EM signal (EM1 or EM2) from an external device (e.g., a first external device 201 or a second external device 202 of FIG. 2), using the EM sensing circuit 210, apply the obtained EM signal (EM1 or EM2) to a feature extraction model 765 to extract feature data 771 or 772, store information mapping the external device 201 or 202 and the electronic device 101 in a database included in the memory 130, and registering an associated service with an external device (e.g., an external device 801 of FIG. 8) identified based on the feature data 771 or 772.

In an embodiment, the memory 130 may include a device registering unit (e.g., a device registering unit 770 of FIG. 7). The instructions may cause the processor 120 to store the extracted feature data 771 or 772 together with information associated with the external device 201 or 202.

In an embodiment, the instructions may cause the processor 120 to receive the feature extraction model (e.g., a feature extraction model 730 of FIG. 7) from an external server (e.g., a server 710 of FIG. 7), via the communication module 190.

In an embodiment, the instructions may cause the processor 120 to identify the external device based on feature data with the highest similarity with the feature data of the EM signal between the extracted feature data 771 or 772.

In an embodiment, the EM sensing circuit 210 may generate EM signal data based on the EM signal. The EM signal data may include information about a waveform of the EM signal (EM1 or EM2) or information about a type of the external device 201 or 202 which emits the EM signal (EM1 or EM2.

In an embodiment, the instructions may cause the processor 120 to transmit the obtained EM signal (EM1 or EM2) to an EM server (e.g., an EM server 310 of FIG. 3) having information associated with the external device 201 or 202 and receive feature data (e.g., the extracted feature data 810 of FIG. 8) extracted from the EM signal (EM1 or EM2) from the EM server 310, via the communication module 190.

In an embodiment, the instructions may cause the processor 120 to receive the information associated with the external device 201 or 202 together with the feature data 810 from the EM server 310, via the communication module 190.

A method for identifying an external device 801 in an electronic device 101 may include sensing an EM signal 801 from the external device 801, passing the sensed. EM signal 802 through a feature extraction model 765 learned using learning data 720 to extract feature data 810, comparing a similarity between the extracted feature data 810 and feature data 771 or 772 registered in a memory 130 of the electronic device 101, and expanding the registered feature data 771 or 772 or registering information associated with the external device 801, based on the compared result.

In an embodiment, the expanding of the registered feature data 771 or 772 may include storing (e.g., operation 1260 of FIG. 12) the extracted feature data 771 or 772 in the memory 130 and using the stored feature data 771 or 772 as feature data identifying the external device 751 or 752 corresponding to the extracted feature data 771 or 772, when it is determined that the extracted feature data 810 is information generated by an external device (e.g., the first external device 751 or the second external device 752 of FIG. 7) registered in the memory 130.

In an embodiment, the registering of the information associated with the external device 801 may include, when it is determined that input external device information and/or the extracted feature data 810 is information generated by a new external device rather than the external device 751 or 752 registered in the memory 130 and/or extracted feature data, registering (operation 1270 of FIG. 12) the input external device information and/or the extracted feature data 810 as feature data identifying the new external device. The registering as the feature data identifying the new external device may include receiving confirmation about whether to register the external device 751 or 752 as the new external device from a user.

In an embodiment, the method may further include, when the extracted feature data 810 is previously registered, additionally identifying (e.g., operation 1350 of FIG. 1.3) context information including information of a registration situation such as a location, surrounding environment information, or a state of the electronic device and expanding (e.g., operation 1370 of FIG. 13) the registered feature data, when the context information is identical to context information of an external device registered in the memory.

In an embodiment, the method may further include, when the context information is identical to context information of an external device registered in the memory 130, allowing (e.g., operation 1450 of FIG. 14) the registered external device to interwork with a service associated with the external device.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry", A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. A method for interworking with an external device in an electronic device, the method comprising:
   obtaining an electromagnetic (EM) signal from the external device;
   passing the obtained EM signal through a feature extraction model to extract feature data;
   comparing a similarity between the extracted feature data and feature data of an EM signal obtained from a plurality of external devices;
   displaying candidate devices, among the plurality of external devices, similar to the extracted feature data based on the similarity;
   receiving an input for selecting one of the candidate devices associated with the external device;
   generating registration information based on the extracted feature data and the selected candidate device associated with the external device; and
   storing the generated registration information in a database of a memory.

2. The method of claim 1, wherein the input for selecting one of the candidate information associated with the external device includes a selection window capable of selecting the external device, a quick menu of displaying external devices recently interworking, a notification window of notifying a user of information to be input, and/or an input window capable of inputting the external device.

3. The method of claim 1, wherein the generating of the registration information includes:
receiving context information including information associated with a situation, a location, and/or an environment where the registration information is generated.

4. The method of claim 1, further comprising:
generating the feature extraction model,
wherein the generating of the feature extraction model includes:
previously collecting an EM signal of at least one external device and constructing learning data, and
wherein the learning data includes type 1 in a form where there is information about the EM signal and where there is a tag displaying whether the EM signal is generated from a certain external device or type 2 where there is only the information about the EM signal.

5. The method of claim 4, wherein the feature extraction model is generated based on a supervised learning method, and
wherein the supervised learning method includes a CNN classifier model.

6. The method of claim 4, wherein the feature extraction model is generated based on an unsupervised learning method, and
wherein the unsupervised learning method includes an autoencoder model.

7. An electronic device, comprising:
an input device;
a display device;
a communication module;
an electromagnetic (EM) sensing circuit configured to obtain an EM signal;
at least one processor operationally connected with the input device, the display device, the communication module, and the EM sensing circuit;
a memory operationally connected with the processor; and
a device registering unit operationally connected with the memory,
wherein the memory stores instructions, when executed, causing the at least one processor to:
obtain an EM signal from an external device, using the EM sensing circuit;
apply the obtained EM signal to a feature extraction model to extract feature data;
store information mapping the external device and the electronic device in a database included in the memory;
register an associated service with an external device identified based on the feature data
store the extracted feature data together with information associated with the external device;
identify the external device based on feature data with the highest similarity with the feature data of the EM signal between the extracted feature data; and
display candidate devices, similar to the extracted feature data.

8. The electronic device of claim 7, wherein the instructions cause the at least one processor to:
receive the feature extraction model from an external server, via the communication module.

9. The electronic device of claim 7, wherein the EM sensing circuit generates EM signal data based on the EM signal, and
wherein the EM signal data includes information about a waveform of the EM signal or information about a type of the external device of emitting the EM signal.

10. The electronic device of claim 7, wherein the instructions cause the at least one processor to:
transmit the obtained EM signal to an EM server having information associated with the external device, via the communication module; and
receive feature data extracted from the EM signal from the EM server.

11. The electronic device of claim 10, wherein the instructions cause the processor to:
receive the information associated with the external device together with the feature data from the EM server, via the communication module.

* * * * *